US005786628A

United States Patent [19]

Beilstein, Jr. et al.

[11] Patent Number: 5,786,628
[45] Date of Patent: Jul. 28, 1998

[54] METHOD AND WORKPIECE FOR CONNECTING A THIN LAYER TO A MONOLITHIC ELECTRONIC MODULES SURFACE AND ASSOCIATED MODULE PACKAGING

[75] Inventors: Kenneth Edward Beilstein, Jr., Essex Junction; Claude Louis Bertin, South Burlington; John Edward Cronin, Milton; Wayne John Howell, Williston; James Marc Leas, South Burlington, all of Vt.; David Jacob Perlman, Wappingers Falls, N.Y.

[73] Assignee: International Business Machines Corporation, Armonk, N.Y.

[21] Appl. No.: 951,663

[22] Filed: Oct. 16, 1997

Related U.S. Application Data

[63] Continuation of Ser. No. 471,666, Jun. 6, 1995, abandoned, Division of Ser. No. 313,976, Sep. 28, 1994, Pat. No. 5,567,654.

[51] Int. Cl.⁶ .................... H01L 23/06; H01L 23/02
[52] U.S. Cl. .................... 257/684; 257/686; 257/725; 257/783
[58] Field of Search .................... 257/686, 698, 257/723, 724, 725, 684, 778, 783

[56] References Cited

U.S. PATENT DOCUMENTS

| | | | |
|---|---|---|---|
| 4,390,598 | 6/1983 | Phy | 428/577 |
| 4,494,688 | 1/1985 | Hatada et al. | 228/180 |
| 4,693,770 | 9/1987 | Hatada | 156/151 |
| 4,721,994 | 1/1988 | Mine et al. | 357/70 |
| 4,876,221 | 10/1989 | Hatada | 437/212 |
| 4,996,583 | 2/1991 | Hatada | 357/70 |
| 5,008,997 | 4/1991 | Phy | 29/827 |
| 5,057,456 | 10/1991 | Dehaine | 437/206 |
| 5,059,557 | 10/1991 | Cragon et al. | 437/208 |
| 5,192,716 | 3/1993 | Jacobs | 437/209 |
| 5,338,900 | 8/1994 | Schneider et al. | 174/250 |
| 5,404,044 | 4/1995 | Booth et al. | 257/698 |
| 5,502,667 | 3/1996 | Bertin et al. | 365/51 |
| 5,567,654 | 10/1996 | Beilstein, Jr. et al. | 437/209 |

OTHER PUBLICATIONS

Acocella, J., "Via Processing Technique For Decal Transfer Technology," IBM Technical Disclosure Bulletin, vol. 32, No. 2, pp. 475–476, Jul. 1989.

*Primary Examiner*—David Ostrowski
*Attorney, Agent, or Firm*—Heslin & Rothenberg, P.C.

[57] ABSTRACT

A fabrication method and resultant monolithic electronic module having a separately formed thin-film layer attached to a side surface. The fabrication method includes providing an electronic module composed of stacked integrated circuit chips. A thin-film layer is separately formed on a temporary support which is used to attach the thin-film layer to the electronic module. The disclosed techniques may also be used for attaching an interposer, which may include active circuity, to an electronic module. Specific details of the fabrication method, resulting multichip packages, and various thin-film structures are set forth.

11 Claims, 24 Drawing Sheets

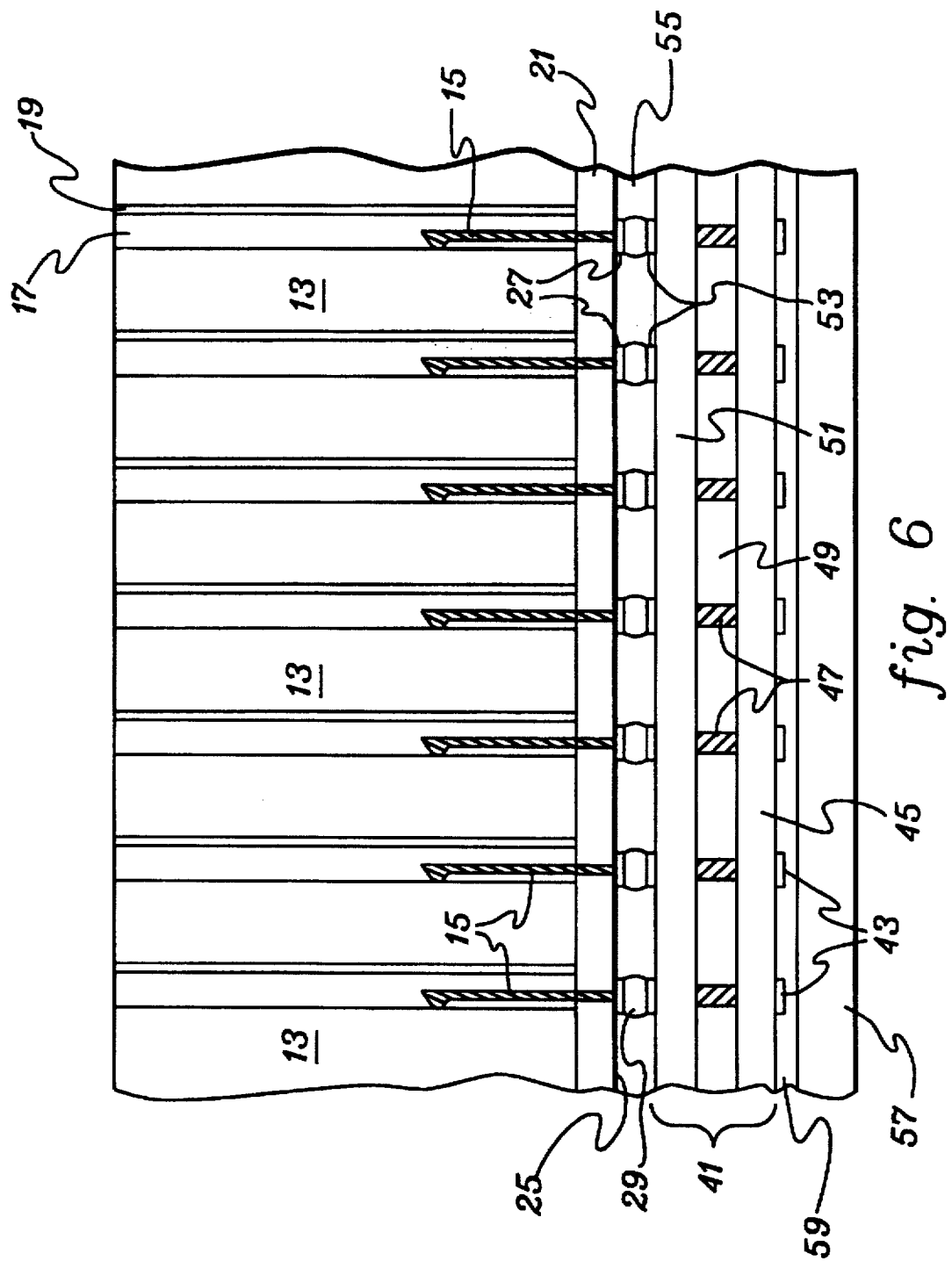

METHOD AND WORKPIECE FOR CONNECTING A THIN LAYER TO A MONOLITHIC ELECTRONIC MODULES SURFACE AND ASSOCIATED MODULE PACKAGING

This application is a continuation, of application Ser. No. 08/471,666 filed Jun. 6, 1995, now abandoned, which was a division of 08/313,976, filed Sep. 28, 1994, now U.S. Pat. No. 5,567,654, issued Oct. 22, 1996.

TECHNICAL FIELD

The present invention relates in general to high density electronic packaging which permits optimization of the number of circuit elements to be included in a given volume. More particularly, this invention relates to a technique for establishing a side surface interconnection structure on an electronic module, comprising for example a densely stacked array of multiple semiconductor layers interconnected at least partially by the interconnection structure. A variety of packaging options for electronic modules and associated elements are also presented. These include, for example, combinations of electronic modules and active integrated circuit chips coupled to various substrates. For example, this invention includes attaching an electronic module comprising memory chips to a processor chip. Further, encapsulated electronic packages are disclosed.

BACKGROUND OF THE INVENTION

Since the development of integrated circuit technology, computers and computer storage devices have been made from integrated circuit chips formed from wafers of semiconductor material. After a wafer is made, the chips are typically separated from each other by dicing the wafer. Thereafter, the individual chips are bonded to carriers of various types, interconnected by wires and packaged. As technology enhancements increase, more circuits are required per chip. This is accomplished by (a) making the circuits smaller and (b) making the chips larger. However, there is a practical limit to both. Making chips larger requires larger field size optics, which is now at a physical limitation. Thus, increasing the density by expanding the "two-dimensions" of the chips becomes prohibitive. Currently, physical chip size limitations are overcome by making chips as large as possible, and dividing the required entire circuit function into several chips, which are electrically connected together. However, this introduces undesirable signal delays, capacitance, and inductance, as signals travel between chips.

Recently, semiconductor structures comprising three-dimensional arrays of chips have emerged as an important packaging approach. A typical three-dimensional electronic module (one example of a semiconductor structure) consists of multiple integrated circuit chips adhesively secured together as a monolithic structure (a "stack"). A metallization pattern is often provided directly on one (or more) side surface(s) of the electronic module for interconnecting the chips in the stack and for electrical connection of the stack to circuitry external to the module. The metallization pattern can include both individual contacts and bussed contacts, and multi-level wiring.

One significant parameter in the fabrication of any electronic module is inter-chip spacing. If not controlled, then the number of semiconductor chips stackable in a given volume is potentially adversely affected because the wiring on the side of the stack takes into account the chip to chip final thickness. If the final thickness is allowed to vary too much, the wiring density on the side of the stack suffers. Also, the thickness of the individual semiconductor chips to be packaged in an electronic module can vary. The combined variance of the chip thickness and inter-chip spacing in turn causes alignment problems when a metallization pattern is to be formed directly on a side surface of the electronic module, as has been the conventional approach. This is because a prefabricated pattern mask is typically employed during the side surface metallization formation process and if inter-chip spacing is inconsistent, then alignment of the mask with the transfer wirings may be impossible.

A number of methods have been proposed for regulating inter-chip spacing, including: selecting and ordering the chips so that the average spacing remains constant; varying the thickness of the adhesive layer to compensate for variances in inter-chip thicknesses (see, for example, U.S. Pat. No. 4,999,311); or improving the consistency of the thickness of the chips and the adhesive layers. All of these methods are useful in forming the electronic module of the present invention.

Typically, the metallization pattern is formed using photolithography directly on a side surface of the electronic module. Thus, conventional fabrication of the electronic module must be completed before side surface metallization begins. The extra process steps associated with lithography on a side surface detracts from the yield of functional electronic modules and can increase cost and complexity of electronic module fabrication. The fabrication technique proposed herein eliminates this complex sequential processing.

Before an electronic module with associated side surface metallization may be incorporated into the next level of packaging, possibly interconnecting other chips, the electronic module must be appropriately packaged. In packaging electronic modules and related components, consideration must be given to the tradeoff between achieving high circuit density and providing means to remove heat.

For example, it is desirable to locate a stack of memory chips (i.e., a memory module) in close proximity to other high-power electronic modules or high powered devices (such as processors). Close proximity, however, introduces a substantial heat dissipation problem. The present invention is also directed towards solving these problems.

DISCLOSURE OF THE INVENTION

Briefly described, the present invention comprises, in a first aspect, a process for establishing a thin-film layer on a substantially planar surface of a semiconductor structure. The thin-film layer is first formed in association with a temporary support separate from the semiconductor structure. Thereafter, the layer is electrically coupled to the substantially planar surface of the semiconductor structure such that the thin-film layer physically bonds to the substantially planar surface, and the temporary support is coupled to the semiconductor structure. The temporary support is then decoupled from the semiconductor structure such that the thin-film layer remains electrically coupled and physically bonded to the substantially planar surface.

As one enhancement, the thin-film layer may comprise a metallization layer and the semiconductor structure may comprise a plurality of stacked integrated circuit (IC) chips having a plurality of edge surfaces that at least partially define the substantially planar surface of the semiconductor structure. The electrical coupling step would then include electrically coupling the metallization layer to the substantially planar surface of the semiconductor structure such that the metallization layer at least partially electrically interconnects the stack of IC chips.

In another aspect, the thin-film layer may comprise a metallization layer formed on a first main surface of a substrate; the substrate having an active circuit layer formed on a second main surface. The metallization layer and the active circuit layer are electrically connected by conductive vias in the substrate extending between the two main surfaces. Further, the active circuit layer may have electrical contacts disposed on it for facilitating electrical connection of the semiconductor structure to external circuitry.

In an alternate aspect, the thin-film layer may comprise a first metallization layer formed on a first main surface of a passive film; the passive film having a second metallization layer formed on a second main surface. The metallization layers are connected by conductive vias (or trenches) in the passive film extending between the two main surfaces. Further, the second metallization layer may have electrical contacts disposed on it for facilitating electrical connection of the semiconductor structure to external circuitry.

In both the passive film and substrate embodiments, processing might include, for example, formation of the various layers separate from the semiconductor structure on a temporary adhesive layer positioned on a temporary support. Processing then continues as described above. Specifically, the metallization layer is electrically coupled to the substantially planar surface of the semiconductor structure such that the metallization layer physically bonds thereto and the temporary support is physically coupled to the semiconductor structure. Thereafter, the temporary support is detached from the semiconductor structure along the temporary adhesive layer, while the metallization layer, substrate and active circuit layer (or second metallization layer) remain physically bonded to the substantially planar surface of the semiconductor structure.

In yet another aspect, the present invention comprises a novel temporary workpiece for attaching a thin-film layer to a substantially planar surface of a semiconductor structure. The temporary workpiece includes a temporary support, a temporary adhesive layer disposed on a surface of the temporary support, and the thin-film layer coupled to the temporary support by the temporary adhesive layer. The workpiece may be employed to "transfer" the thin-film layer to the substantially planar surface of the semiconductor structure as summarized above. In particular, the thin-film layer can be physically bonded to the substantially planar surface of the semiconductor structure, after which the temporary support would be decoupled from the thin-film layer along with the temporary adhesive layer. The thin-film layer electrically connects to the semiconductor structure. As an enhancement, the workpiece may also include either an active circuit layer or a metallization layer for transfer with the thin-film layer to the semiconductor structure.

In another aspect, the present invention consists of an enhanced electronic module comprising a semiconductor structure having a substantially planar surface, and a separately formed, thin-film layer bonded to the substantially planar surface of the semiconductor structure. The thin-film layer is electrically attached to the semiconductor structure, and provides functions associated therewith. By way of example, the thin-film layer may comprise a metallization layer. Alternatively, the thin-film layer may comprise an active circuit layer, in which case it provides functions associated with the semiconductor structure.

If the thin-film layer is a first metallization layer, it may be formed on either a substrate or a passive film. The passive film might have a second metallization pattern formed on an opposite planar surface from the first metallization pattern; a substrate may have an active circuit layer formed on the opposite planar surface. In either case, the two opposite planar layers (e.g., first metallization layer and second metallization layer, or metallization layer and active circuit layer) may be electrically connected by conductive vias (or trenches) extending through the passive film or substrate. Further, either the active circuit layer or second metallization layer may have electrical contacts disposed on it for facilitating electrical connection of the electronic module to external circuitry.

To restate, in all embodiments discussed up to this point, the present invention advantageously produces a semiconductor structure, for example, an electronic module comprising multiple IC chips, having separately formed side surface metallization. The metallization layer is transferred to the electronic module from a temporary support that is detached along a temporary adhesive layer. If desired, the metallization layer may be formed in conjunction with an active circuit layer and/or electrical contact pads for connecting the associated electronic module to an external device(s). Those skilled in the art will note that the metallization layer is established on the side surface of the electronic module without any lithography steps directly on the side surface of the module, thus avoiding the time, expense, inability to test or rework and complexity associated with complex processing on the side surface of the electronic module.

The present invention further encompasses various packages for semiconductor structures, electronic modules and associated components as well as processes for creating the packages. In one embodiment, an electronic package includes an electronic module and an interposer having an active circuit layer for providing functions associated with the electronic module. The electronic module comprises a stack of integrated circuit chips whose edges partially define a side surface of the module. The substrate has a substantially planar main surface which is electrically and mechanically coupled to the side surface of the electronic module. As an enhancement, the side surface of the electronic module may have a length x and the substantially planar surface of the substrate may have a length y, wherein $x \leq y$. Further, the electronic package may include a cap which may hermetically seal the substrate.

In another aspect, the present invention comprises an electronic package having an electronic module, a cavity substrate having a cavity therein, and an active integrated circuit chip. The electronic module comprises a stack of integrated circuit chips and has a substantially planar surface. The active integrated circuit chip is mechanically coupled to, and disposed between, the substantially planar surface of the electronic module and the cavity substrate. Both the electronic module and the active integrated circuit chip are recessed within the substrate's cavity. As an enhancement, the cavity substrate may be formed to have a plurality of wirebond pad levels for efficiently accommodating wirebond connections to structures contained within the electronic package.

A further aspect of the invention includes an electronic package comprising a cavity substrate having a cavity therein, a first semiconductor structure, and a second semiconductor structure. The first semiconductor structure is contained within the cavity such that the substrate and a substantially planar surface of the first element comprise a substantially planar receiving surface. Mechanically coupled to this surface is the second semiconductor structure. As an enhancement, the first semiconductor structure may be an active integrated circuit chip and the second semiconductor structure may be an electronic module comprising a stack of integrated circuit chips. Alternatively, the elements corresponding to the first and second semiconductor structures may be interchanged.

In yet another aspect, the present invention encompasses an electronic package comprising an electronic module having a stack of integrated circuit chips, and a substrate having both a cavity and an opening therein. Recessed within the cavity is the electronic module having a substantially planar surface mechanically coupled to the substrate. As an enhancement, the opening may facilitate a coolant to pass around the electronic module for cooling the module. Further, the opening may accommodate an active integrated circuit chip attached to the electronic module, and even a means for thermal management attached to the active integrated circuit chip.

A further aspect of the present invention comprises a computer unit having a processor chip and a first electronic module, and method for forming the same. The processor chip has a substantially planar main surface and includes a cache memory controller. The first electronic module comprises a plurality of stacked integrated circuit chips and has a first substantially planar surface. Further, the first electronic module includes a cache memory circuit. The substantially planar main surface of the processor chip is mechanically and electrically coupled to the first substantially planar surface of the first electronic module such that the cache memory controller is electrically connected to the cache memory circuit.

As an enhancement, the first electronic module may have a second substantially planar surface having a first plurality of electrical contacts thereon. At least some of the electrical contacts are electrically coupled to the processor chip for facilitating electrical contact to the processor. Furthermore, the invention may comprise a second electronic module having a plurality of stacked IC chips and having a first substantially planar surface. The second electronic module also includes a second memory circuit. The first substantially planar surface of the second electronic module is mechanically coupled to the second substantially planar surface of the first electronic module such that the first and second electronic modules are electrically coupled via the first plurality of electrical contacts on the first electronic module.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

FIG. 6 is a partial cross-sectional view of an electronic module having a thin-film structure (including metallization layer), and a temporary support coupled thereto in accordance with the present invention;

BEST MODE FOR CARRYING OUT THE INVENTION

Certain preferred embodiments for establishing a metallization layer on a side surface of a semiconductor structure are presented herein. While particular embodiments presented describe a semiconductor structure comprising an electronic module, other semiconductor structures may be utilized (for example, wafers or IC chips).

Figure 1:
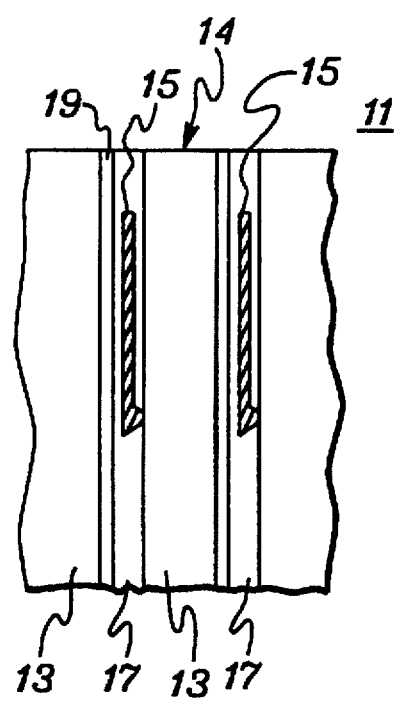
FIG. 1 is a partial cross-sectional view of a stack of multiple semiconductor chips laminated together according to an embodiment of the present invention.

FIG. 1 is a partial cross-sectional view of an electronic module 11, comprising a plurality of stacked integrated circuit chips 13 (a plurality of chips, "stacked" to form an electronic module). Typical functions implemented by chips 13 may include, for example, memory, interface, processor (for example, a microprocessor) and/or control functions, although each chip may include any function known in the art for implementation on a semiconductor chip. A transfer metal 15 is associated with each integrated circuit (IC) chip to connect the IC chip to other chips in electronic module 11 or to external circuitry. When stacked, transfer metal 15 of chips 13 extend towards at least one selected side surface 14 of the unprocessed electronic module 11. Insulator 17, disposed on the surface of each chip 13 both above and below transfer metal 15, electrically insulates and physically isolates the respective transfer metal(s). The semiconductor chips are laminated together via layers of a permanent adhesive 19.

As a specific example, electronic module 11 may comprise a memory module, with each semiconductor chip 13 having a respective insulator layer 17, such as a polyimide, formed above the active surface of the chip. Insulator 17 also electrically insulates the respective transfer metal(s) 15, which may comprise a Ti/Al(Cu) structure. Transfer metal 15 electrically connects to the active I/O pads of the respective chips via conventional metallized vias formed in the insulator 17. The layers of permanent adhesive may comprise any one of various commercially available high-temperature adhesive materials, such as Thermid manufactured by National Starch and Chemical Co., Bridgewater, N.J.

Figure 2A:
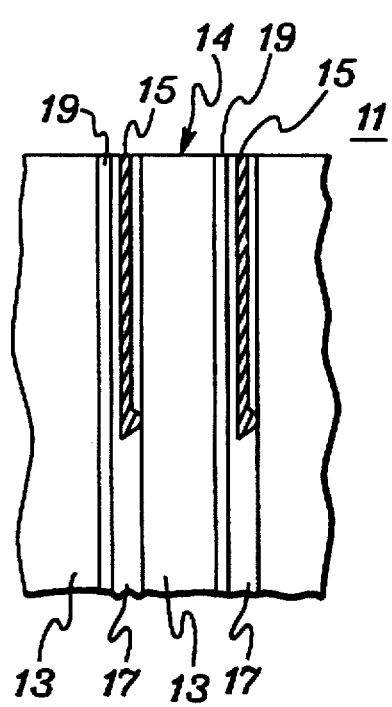
FIG. 2A is a partial cross-sectional view of the stack of FIG. 1 subsequent to preferential etching of a side surface of the stack.
Figure 2B:
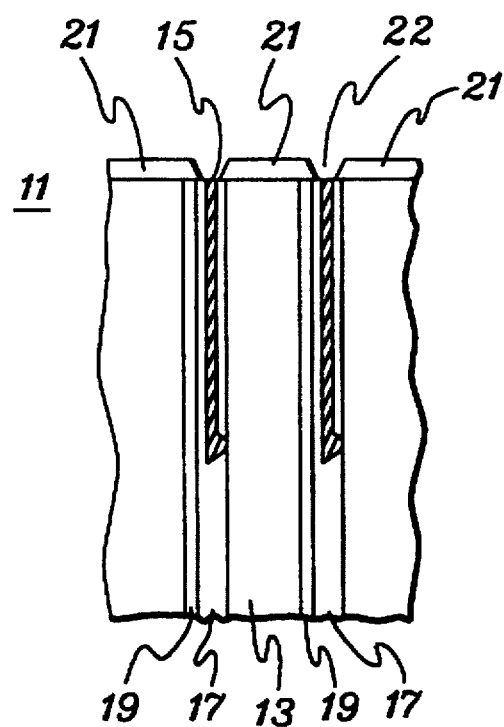
FIG. 2B is ea partial cross-sectional view of the stack of FIG. 2A subsequent to the patterned formation of an insulating layer on the planarized side surface.

As a specific process example, once the semiconductor chips have been laminated into a stack, the selected side surface 14 undergoes processing to expose the ends of the transfer metal 15 (FIG. 2A). Thereafter, an insulation layer 21 is deposited and patterned so as to form vias 22 to the exposed ends of transfer metal 15 (FIG. 2b). Thus, transfer metal 15 extends to the chip edges with adequate insulation but without the need for alternate insulating means (for example, a moat of insulation formed underneath the transfer metal).

Figure 3A:
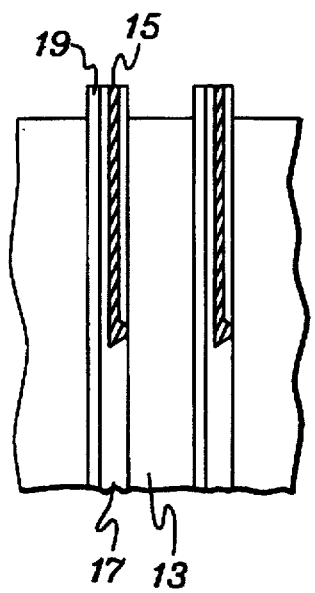
FIG. 3A is a partial cross-sectional view of the stack of FIG. 2B subsequent to the preferential removal of a portion of the edges of the chips pursuant to the present invention.
Figure 3B:
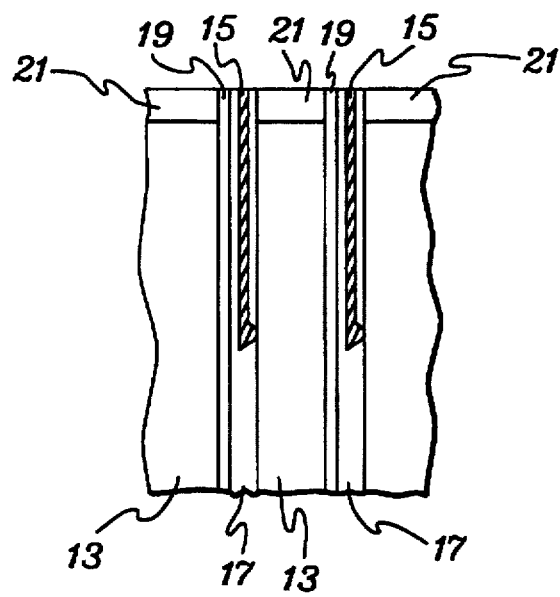
FIG. 3B is a partial cross-sectional view of the stack of FIG. 3A subsequent to the formation of an insulating layer on the edges of the chips and exposing of the interchip transfer metallizations.

An alternative example of insulating the selected side surface of the electronic module and exposing the ends of the transfer metal is depicted in FIGS. 3A & 3B. Once the semiconductor chips have been laminated into a stack, selected side surface 14 undergoes processing to expose the transfer metal 15 (FIG. 2A). The edges of chips 13 are preferentially removed (FIG. 3A), e.g., using a selective etch process. Thereafter, an insulation layer is deposited and polished to expose only the ends of the transfer metal 15 (FIG. 3B).

Figure 4:
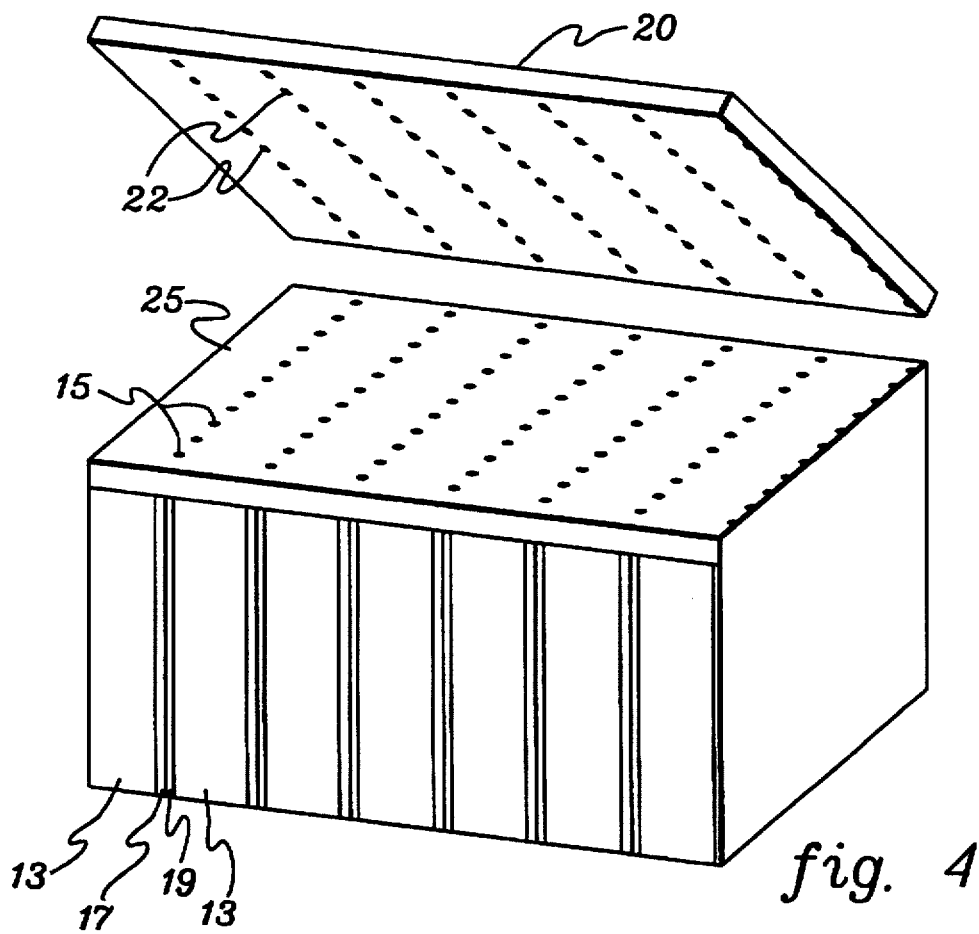
FIG. 4 is a perspective view of an electronic module and Molybdenum (Mo) mask according to the present invention.
Figure 5:
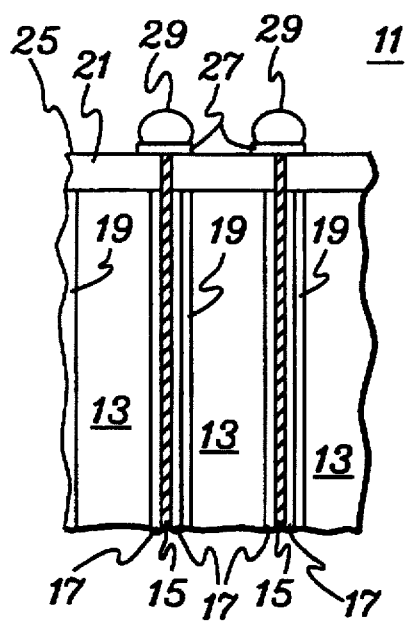
FIG. 5 is a partial cross-sectional view of an electronic module after completion of fabrication in accordance with one embodiment of the present invention.

As shown in FIGS. 4 & 5, appropriate electrical contacts 27 are next formed on the resultant side surface 25 of electronic module 11 in association with the respective transfer metal 15. Formation of these electrical contacts may proceed by use of a Molybdenum (Mo) mask 20 (FIG. 4) having holes 22 formed therein located to align with the exposed transfer metal 15 when the mask is appropriately positioned on the side surface of the electronic module.

It should be noted that the T-Connect structure depicted in FIGS. 4 and 5 (and subsequent figures) have been simplified for reasons of clarity. T-Connects are typically formed by well known processes including the deposition of a metallurgical structure on the side surface of electronic modules such as, for example, those shown in FIG. 2B or FIG. 3B.

As shown in FIG. 5, in one embodiment, Ball Limiting Metallurgy (BLM) pads 27 are used as electrical contacts. Formation of BLMs can be accomplished through the masking/evaporation process described above. In particular, a BLM structure can be created by evaporating a three layer metal structure composed of chrome, copper and gold. Alternately, structures of, for example, Ni/Au, Ti/Cu/Au, Cu, Cr/Cu and Ti/Cu may be used. Once electrical contacts 27 have been deposited on the electronic module, solder bumps 29 may be formed on the electrical contacts using the same Mo mask 20. After bumps 29 have been formed, the electronic module is ready for soldering to external electrical circuitry (not shown) or chip interconnect metallization (described below).

Note that the process described herein above for forming BLM pads with solder bumps is achieved without any photolithography (or other lithography) steps. The process is faster, easier, and less expensive than photolithography processes used to achieve a functionally similar structure (such as fabricating T-connect pads on a surface of an electronic module using photolithography steps).

Figure 5A:
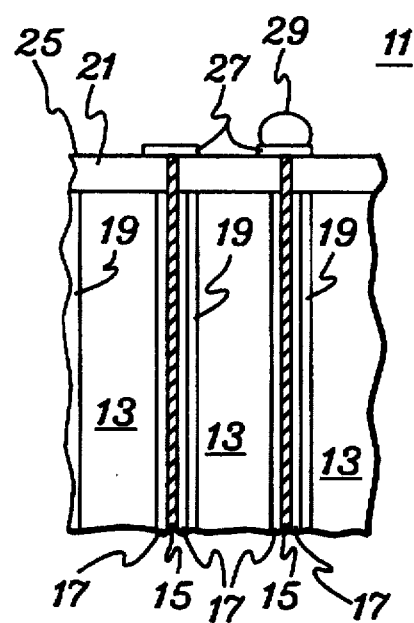
FIG. 5A is a partial cross-sectional view of the electronic module of FIG. 5 subsequent to the removal of a solder bump.

A variation of this process that is capable of handling shorts (or other severe electrical defects) associated with specific chips in the stack entails: (1) deposition of the BLM pads and solder bumps on the side surface of the electronic module; (2) electrical test of the chips comprising the electronic module; and (3) electrical isolation of the defective chip(s) by removal of the solder bumps (FIG. 5A) associated with the BLM pads connected to the defective chip(s). When the electronic module is joined to the next level of assembly (e.g., a substrate/temporary workpiece) there will be no mechanical or electrical interconnection between the BLM pads and the substrate/temporary workpiece pads on which the solder bumps have been removed. This technique is a particularly good processing option in that no photolithographic steps are required.

A further process that is capable of handling shorts (or other severe electrical defects) associated with specific chips in the stack entails: (1) deposition of the BLM pads on the side surface of the electronic module; (2) electrical test of the chips comprising the electronic module; (3) electrical isolation of defective chip(s) (accomplished by depositing an insulation layer over the BLM pads connected to the defective chips); and (4) redeposition of BLM pad and solder bumps. As described above, the BLM and solder bump deposition may utilize a Mo mask process. The deposition of an insulation layer, for example, polyimide, would entail application, patterning, and curing techniques that are well known and currently practiced in the microelectronics industry. Moreover, the redepositions of a BLM pad ensures that solder bumps over the electrically isolated chips adhere well to the surface and act as mechanical support solder bumps when joined to the next level of assembly.

Figure 5B:
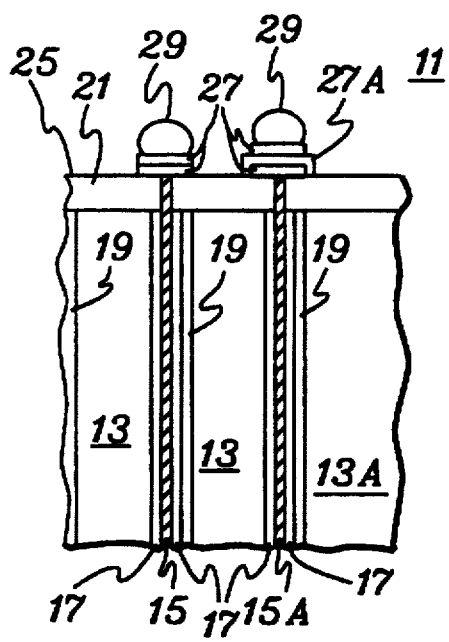
FIG. 5B is a partial cross-sectional view of a fabricated electronic module having an insulated electric contact pursuant to an embodiment of the present invention.

FIG. 5B illustrates the resulting structure following this process wherein electrical insulation layer 27A is used to isolate chip 13A to which transfer metal 15A is connected. The insulation layer 27A thickness is chosen (for example, 1–3 $\mu$m) such that the height variation between electrically connected and non-connected solder bumps is not significant and can easily be accommodated in the join to the next level of assembly.

Variations on this process, exploiting the same inventive concepts are also possible. An alternative process entails executing this selective isolation process on the substrate contact pads to which the electronic module will be joined.

Figure 5C:
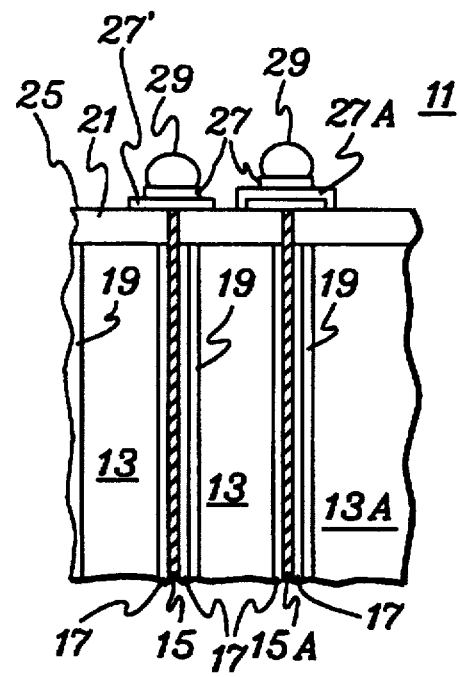
FIG. 5C is a partial cross-sectional view of a fabricated electronic module having a multi-size/multi-layer contact with one contact surface electrically insulated.

Moreover, a further variation used to electrically isolate the defective chip(s) is shown in FIG. 5C. Although similar to FIG. 5B regarding the use of an insulating layer (27A) to isolate a defective chip, the contact pads are sized significantly differently. Bottom contact pad 27' is sized larger than the BLM 27 disposed above it. This difference in size is useful with respect to the testing of the chips within the module. Particularly, before the BLM pads (27) are deposited, probes are used which make contact with contact pads 27'. These probes may cause damage to the surface of the contact pads. Thus, by provisioning the pads larger than the BLMs deposited on top of them, testing is performed to areas of the bottom contact pads at locations outside where the BLMs will be deposited. Thus, the areas on which the BLMs are deposited are undisturbed by the test probes. In order to eliminate solder wetting pad 27' during solder reflow, a non-wettable material such as, for example, chrome can be used as the top layer of pad 27'.

An additional benefit regarding the larger bottom contact pads is derived with respect to the inter-chip spacing tolerance of the electronic module. If the chip lamination processes result in a large variation in the inter chip spacing then larger contact pads will be required in order to "capture," i.e., electrically contact, all of the transfer metal leads 15 presented to the side surface of the module. The smaller BLM pads may then be deposited on top of the larger pads, without regard to variances in inter-chip spacing.

If a contact needs to be electrically isolated (i.e., a defective chip) an insulating layer may be used similar to the embodiment shown in FIG. 5B. Again, an insulating layer (FIG. 5C, 27A) is deposited between the contact pad and the BLM pad disposed above it. In this particular embodiment the insulation layer must be larger than in previous embodiments (FIG. 5B) in order to account for the larger sized bottom contact pad.

FIG. 6 depicts one embodiment of a separate side surface interconnect/active circuit structure, generally denoted thin film structure 41, pursuant to the present invention. A temporary support 57 (composed of, for example, silicon) provides a physically strong temporary support for structure 41, which resides thereon during fabrication and attachment of the structure to the electronic module. Advantageously supporting structure 57 enables the fabrication and attachment of layers to the electronic module that like structure 41 are significantly thinner and mechanically weaker than conventional semiconductor structures. Thus, "thin-film" structures, such as thin-film structure 41, can be attached to the electronic module without fabricating them directly on the electronic module.

A thin-film structure such as thin-film structure 41 may be fabricated using standard wafer processing techniques. To begin, a wafer comprising IC chips having deep conductive trenches (i.e. vias) is fabricated (see, for example, U.S. Pat. No. 5,202,754, "Three-Dimensional Multi Chip Packages and Method of Fabrication," issued Apr. 13, 1993 and incorporated herein by reference). The wafer is then mounted onto a temporary workpiece using a temporary adhesive (the active side of the wafer faces the temporary workpiece). The mounted wafer is then thinned using mechanical and/or chemical techniques, exposing the conductive trenches. Thin-film layers are then built on the wafer, connected to the exposed conductive trenches. These layers may be composed of appropriate combinations of metallization and insulation. The wafer/temporary workpiece combination is then diced forming "thinned two-sided chips" attached to a temporary workpiece.

The temporary workpiece is necessary during this fabrication for providing mechanical support. For example, high yield deposition of insulating films on thin wafers would not be possible without the temporary workpiece. The wafers are far too fragile to withstand the forces developed during, for example, "spin apply" of insulation.

In accordance with the present invention, temporary support 57 is removed once structure 41 has been electrically and mechanically connected to the electronic module via solder bumps 29. This is made possible by interposing temporary adhesive layer 59 between structure 41 and temporary support 57. Many temporary adhesives for use in semiconductor fabrication processing are known in the art, one example being Ditac, manufactured by E. I. DuPont De Nemours and Co. Another temporary adhesive is Ultem, manufactured by General Electric Corp. The combination of temporary support 57, adhesive 59 and structure 41 comprises a "temporary workpiece" that transfers structure 41 to the electronic module. This is because when the temporary support is removed, thin-film structure 41 remains physically and electrically attached to the electronic module via the solder bumps.

Figure 7:
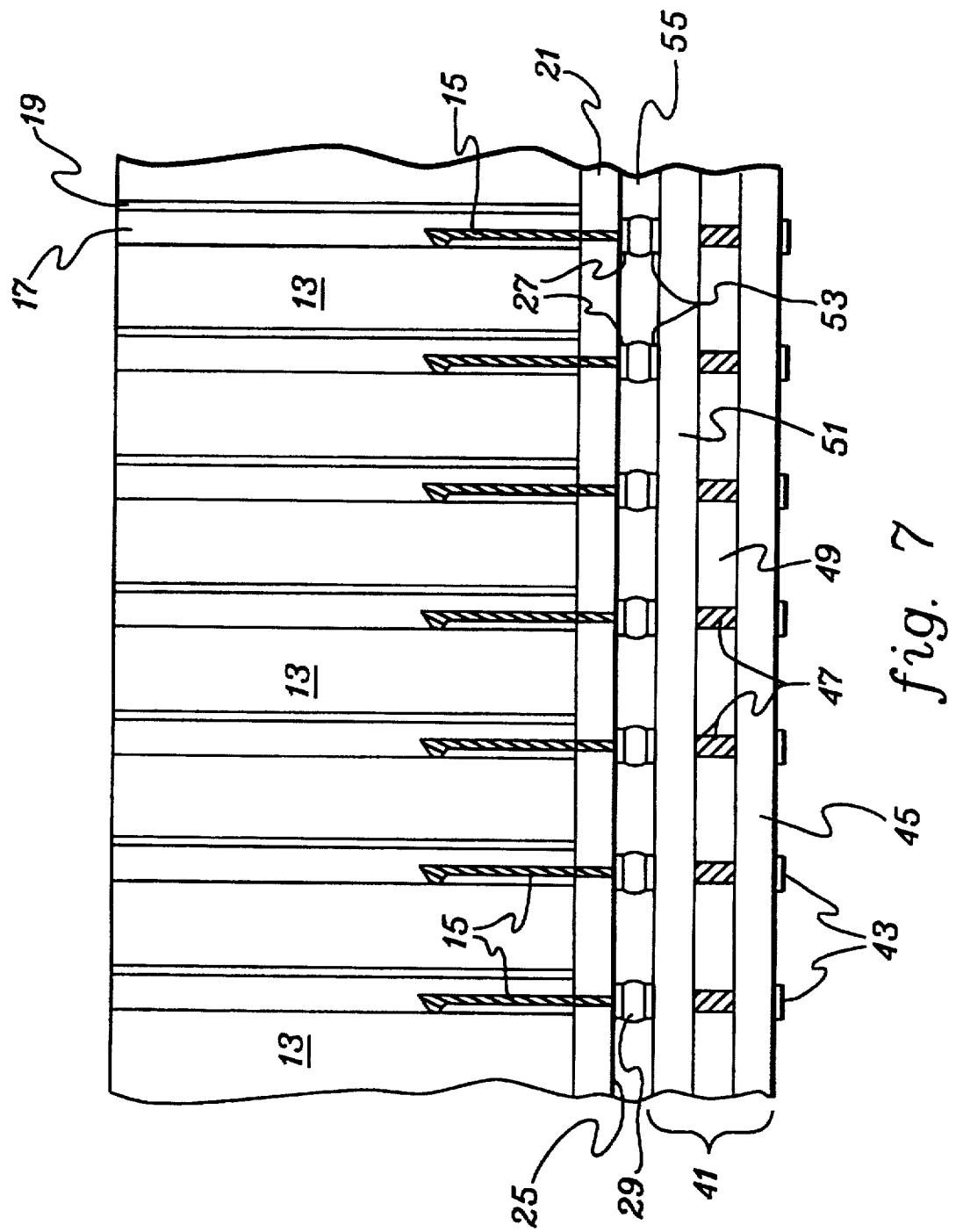
FIG. 7 is a partial cross-sectional view of the electronic module of FIG. 6 after the temporary support has been removed.

FIG. 7 shows the resultant electronic module after temporary support 57 has been removed along the temporary adhesive layer. Layer 51 of structure 41 comprises a metallization layer, which has been formed on a substrate 49. This metallization layer serves two functions. First, as described below, contacts are provided to match those of the electronic module. Second, metallization 51 interconnects at least some of the multiple chips 13 within the electronic module (i.e., at least some chips are electrically connected to at least some other chips). Metallization layer 51 can comprise any standard wiring/metallization layout previously directly formed on the side surface of the electronic module.

Electrical contacts 53 are formed on metallization layer 51 to facilitate electrical attachment of the metallization layer to BLM pads 27 via the solder bumps 29. Electrical contacts 53 may be formed by well known masking/ evaporation techniques, for example, by evaporation of BLM pads. Note that solder bumps 29 formed on BLM pads 27 may alternately be formed on electrical contacts 53 of thin-film structure 41, or on a combination of both pads 27 and contacts 53. Whichever embodiment, solder will be reflowed onto both sets of electrical contacts (or BLM pads) to provide a proper electrical/mechanical connection of structure 41 to the side surface of the electronic module.

Specifically, attachment can be achieved by physically positioning the electronic module so that the BLM pads 27 are aligned with the electrical contacts 53. Once properly positioned, heat is applied until solder bumps 29 melt. The solder bumps are then allowed to cool, thereby establishing a good mechanical and electrical connection. A polymeric material 55 (for example, a silica or alumina filled high-temperature epoxy) is preferably added between thin-film structure 41 and the electronic module to enhance the mechanical connection.

Continuing with the description of the thin-film structure, an active circuit layer 45 is disposed on a planar surface of substrate 49 opposite from metallization layer 51. Active circuit layer 45 may implement any one of various functions, again depending upon the chips 13 to which the layer is connected. For example, if chips 13 comprise memory chips, then the active circuit layer 45 might, for instance, provide a memory controller function.

In one embodiment, substrate 49 is formed using the thin-film techniques described in commonly assigned U.S. Pat. No. 5,270,261, entitled: "Three Dimensional Multichip Package Methods of Fabrication," issued Dec. 14, 1993 and incorporated herein by reference. Briefly summarized, this patent teaches the formation of a stacked chip structure including "trench" interconnects running through a thinned substrate. Using this technique, electrically conductive trenches 47 (i.e., vias) can be formed through substrate 49 so as to extend between its two main planar surfaces, and if desired, to electrically interconnect metallization layer 51 and active circuit layer 45. Trenches 47 significantly simplify electrical connection between layers of structure 41, reduce the need for external interconnect wiring, and further increase interconnect density of the resultant electronic module.

It is also possible that thin-film structure 41 will be flipped over, using a second temporary adhesive and a second temporary support, so that the active circuit layer will be connected adjacent to the electronic module. This provides an advantage in terms of signal propagation.

To continue in the current embodiment, provision is made for connection of thin-film structure 41, and the electronic module to which it is affixed, to external circuitry. In this regard, electrical contacts 43 are deposited on an exposed surface of active circuit layer 45 of structure 41. Contacts 43 can be deposited before active circuit layer 45 is adhesively attached to temporary support 57. Contacts 43 can also be deposited after thin-film structure 41 has been transferred to the electronic module. Conventional techniques may be used to deposit these electrical contacts. Contacts 43 may electrically connect to respective semiconductor chips in the electronic module, to active circuit layer 45, or to both. Many different methods are known in the art which can be used for connecting to electrical contacts 43, including, for example, solder bumps, Tape Automated Bonding (TAB) or wirebond technologies.

From the above discussion, those skilled in the art will note that a highly sophisticated, electronic module has been presented with side surface interconnects, active control circuitry, and contacts ready for electrical attachment to external devices. However, note that the presented structure comprises only one embodiment of the inventive concepts set forth herein. By way of example, variations on the basic inventive concepts are next presented.

Figure 8:
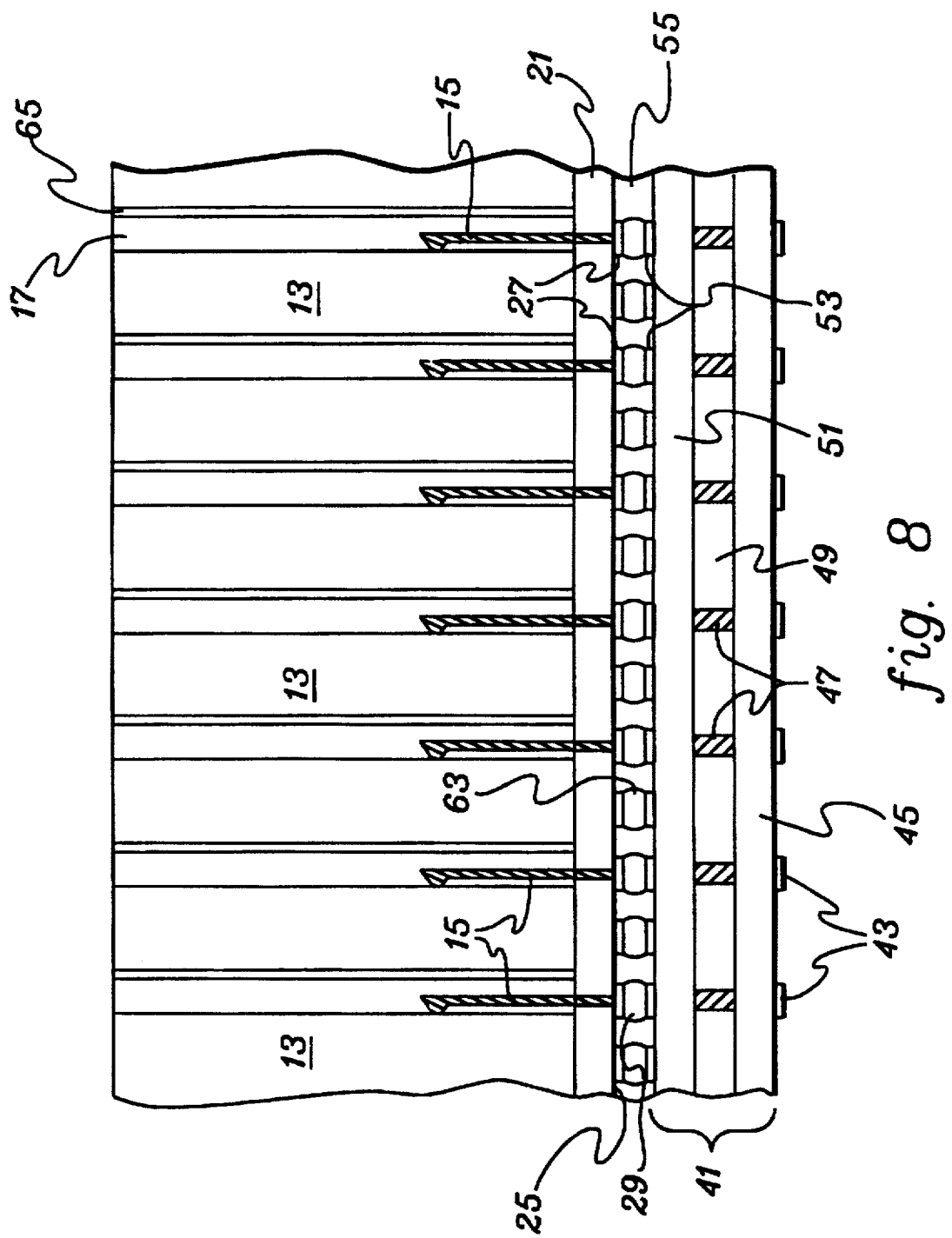
FIG. 8 is a partial cross-sectional view of an alternate embodiment of the electronic module of FIG. 7, wherein balancing pads are interposed between the thin-film structure and the semiconductor chips.

As one variation, the process step of laminating semiconductor chips together into an electronic module (a "stack" of integrated circuit chips) may be eliminated if used in combination with a thin-film structure such as presented above. In such an embodiment, spacers could be employed between the semiconductor chips in place of the permanent adhesive layers 19. As shown in FIG. 8, spacers 65 can provide uniform chip spacing within the electronic module and protect the active surface of each semiconductor chip during fabrication processing. Preferably, uniform interchip spacing is maintained within the electronic module by selecting the widths of individual spacers 65 to compensate for variation in the widths of the semiconductor chips comprising the electronic module. Spacers 65 provide greater control over inter-chip spacing than the use of an adhesive layer between chips, thereby reducing alignment problems with masks, and allowing stacks of greater numbers of chips to be fabricated. Further, if desired, the spacers can be removed after the electronic module is bonded to the metallization layer in order to facilitate improved thermal management (e.g. dissipation of heat from the electronic module by allowing air or liquid to flow between the chips).

The methods used to form electrical contacts 27 on an unglued stack of semiconductor chips differ from the methods presented above. This is because an unglued stack of chips must be aligned and then the alignment must be maintained while electrical contacts 27 on the thin-filmed structure are formed, e.g., using the techniques discussed above. One approach to maintaining alignment of the stack is to use a spring-loaded fixture (not shown).

After chips 13, separated by spacers 65, have been soldered to a thin-film structure (such as structure 41 of FIG. 7), additional mechanical support for the chips might be needed. This is because the stack is not held together by adhesive, and individual chips are mechanically supported only by, e.g., the BLM pads on the edges of the chips. Thus, the chips may tend to tilt, placing mechanical stress on the electrical contacts on both the electronic module and the thin-film structures.

As shown in FIG. 8, 'balancing' pads 63, fabricated on the edge of each chip, can be used to mechanically support chips 13 on thin-film structure 41. These provide support so that each chip 13 may rest on its edge without placing undue stress on associated "active" BLM pads 27. Balancing pads 63 can be fabricated using a Mo mask, with holes corresponding to desired balancing pad locations, in conjunction with conventional evaporation techniques. Both "active" and "balancing" pads may be formed simultaneously by using a Mo mask containing both sets of mask holes. The thickness of balancing pads 63 will then be such as to properly support the associated chips.

Figure 9:
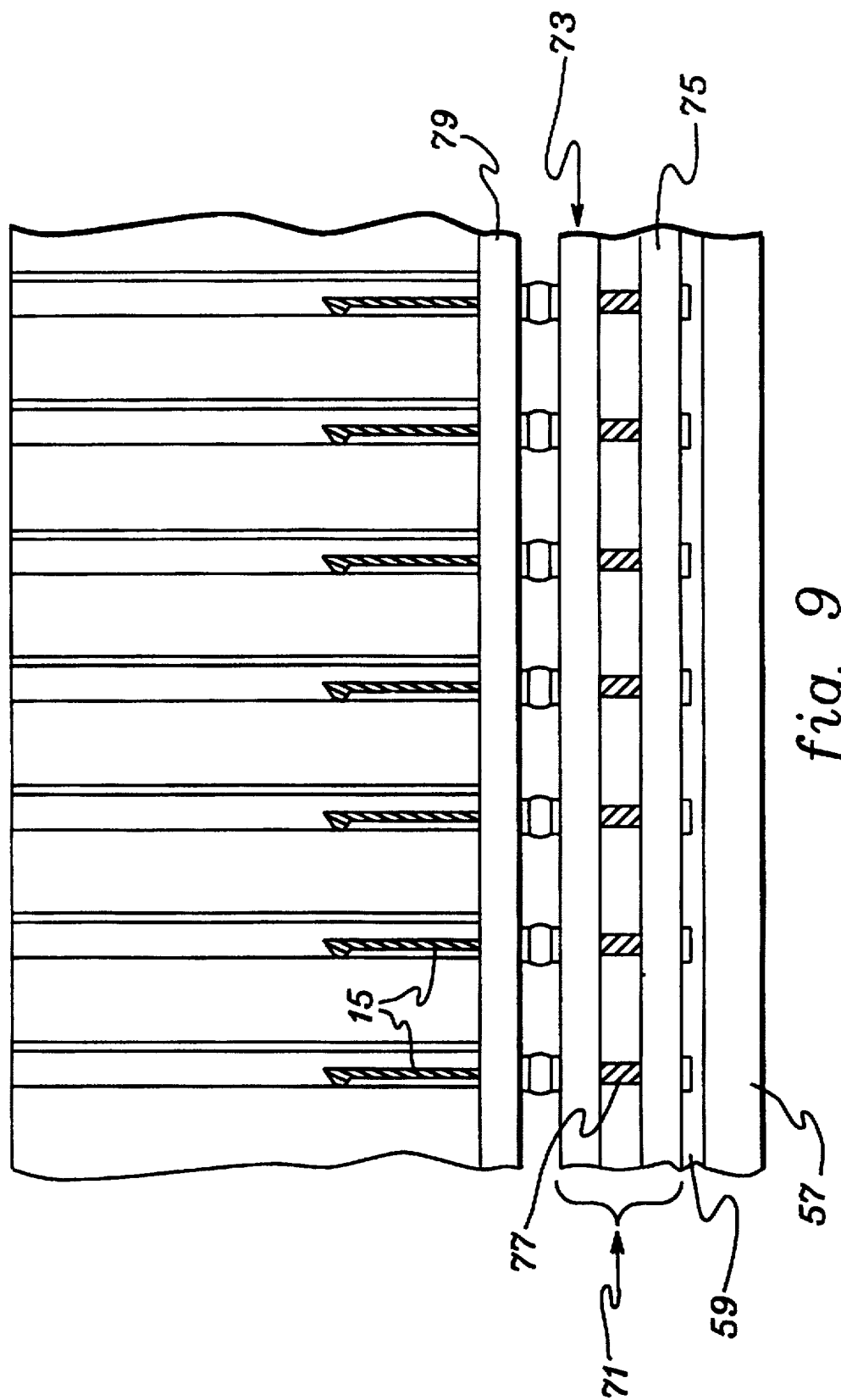
FIG. 9 is a partial cross-sectional view of an electronic module having a passive film (including two metallization layers), and a temporary support coupled thereto in accordance with the present invention.
Figure 10:
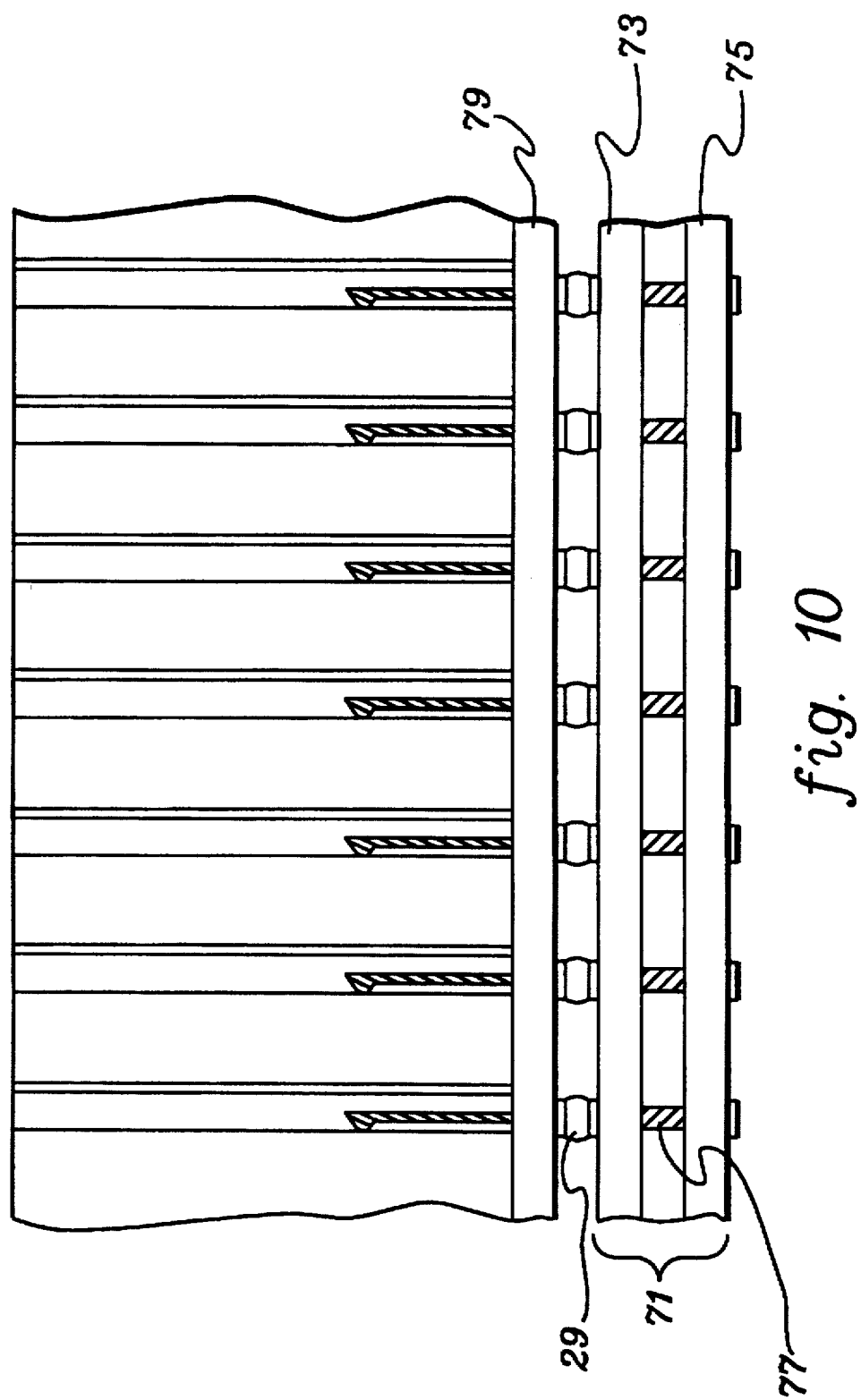
FIG. 10 is a partial cross-sectional view of the electronic module of FIG. 9 after the temporary support has been removed.

As another variation, the thin-film structure may comprise a passive film. Referring to FIGS. 9–10, passive film 71 (one type, for example, is known as a 'flex circuit'), is electrically and mechanically bonded to the electronic module. In the particular embodiment shown in FIGS. 9 and 10, the electronic module has a preexisting side surface metallization layer 79, which may be formed by conventional techniques known in the art (optionally, layer 79 may be omitted). Similar to thin-film structure 41 (FIGS. 6–8), the passive film contains a first metallization layer 73 disposed on a main planar surface bonded to the electronic module. The opposite planar surface of the passive film contains a second metallization layer 75, rather than the active circuit layer 45 of FIGS. 6–8. However, the remaining structure associated with the passive film is similar to that of the thin-film structure of the embodiment presented above. Electrical contacts are disposed on both surfaces of the passive film for connecting the first metallization layer to the electronic module, and the second metallization layer to external circuitry, respectively. Electrically conductive vias 77 interconnect both metallization layers, thereby allowing signals to pass between the electronic module (connected to the first metallization layer) to external circuitry (connected to the second metallization layer).

Numerous materials exist for forming a passive film including polyimide tape for the flex circuit and a wide range of ceramic substrates. In a manner similar to the formation of the previously described thin-film structure, a passive film can be built in layers on a temporary workpiece 57 (FIG. 9.). The workpiece is used during fabrication of the passive film, and subsequent bonding of the electronic module. In this particular embodiment, however, fabrication does not begin with a base chip. Instead, thin-film layers of metallization and insulation are built up on top of the temporary support/ temporary adhesive layer. Vias are opened up within the layers as appropriate, interconnecting various thin-film layers within the film. After bonding has taken place, the temporary workpiece is removed along temporary adhesive 59 (FIGS. 10), with the passive film remaining bonded to the electronic module.

The passive film can have many functions associated therewith. For example, it may be used to (a) provide electrical "bus" connections between chips of the electronic module; (b) provide electrical replacement of a defective chip(s) in the electronic module with spare chips in the module; and (c) provide complex interconnection of the chips within the electronic module in association with the signals provided by external circuitry.

In accordance with the present invention, use of a passive film containing metallized interconnects offers many advantages over conventional side surface metallization. The passive film (1) may be fabricated separate from the electronic module; (2) may contain personalized metallization patterns on both surfaces of the film; and (3) is less expensive than conventional side surface metallization. Personalization processes known in the art for passive film fabrication include (a) line removal processes (for example, laser ablation); (b) line add processes (for example, laser chemical vapor deposition or staple bonding); and (c) prefabrication of the film.

Figure 11:
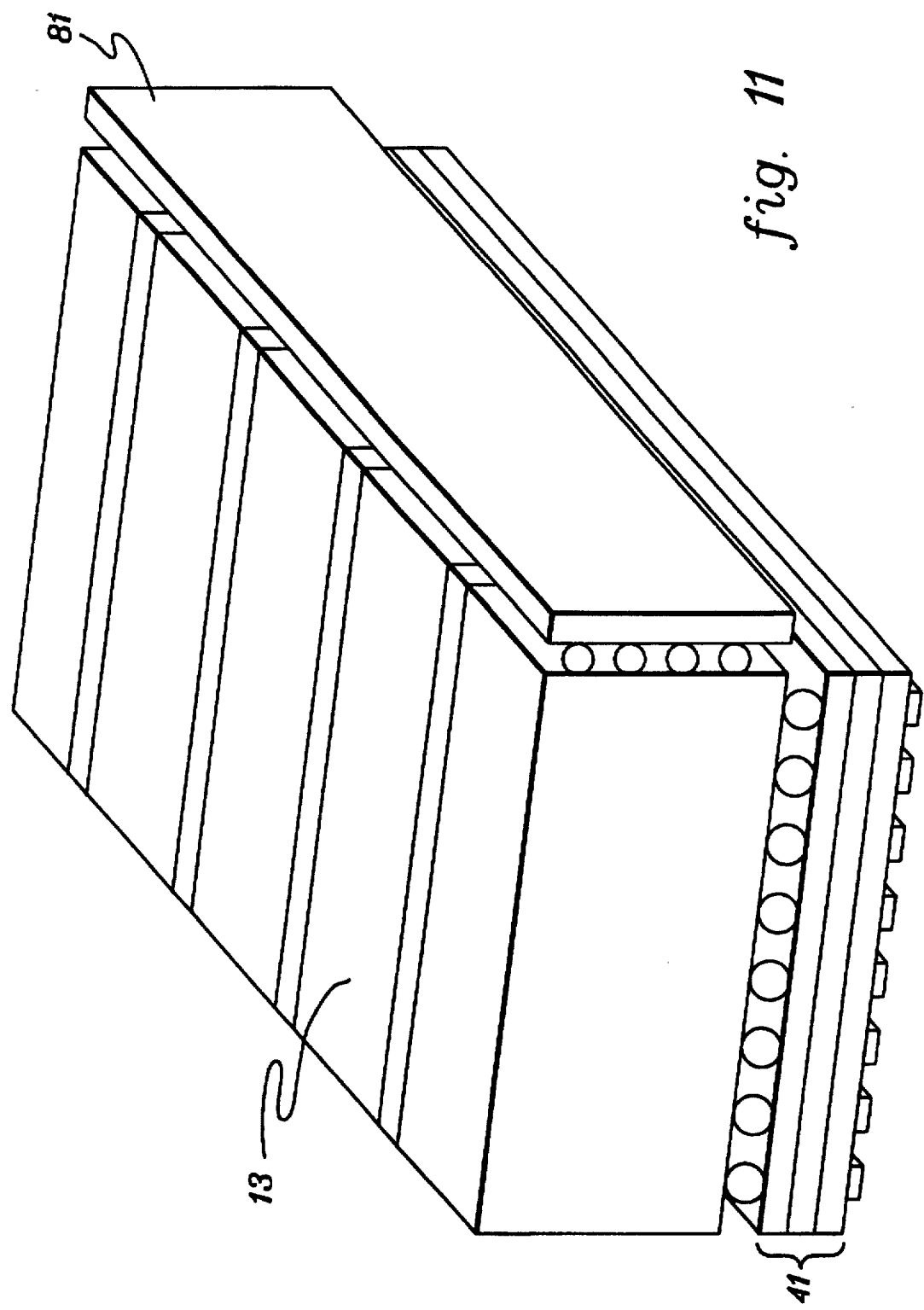
FIG. 11 is a perspective view of an electronic module having thinned layers bonded to two side surfaces thereof in accordance with the present invention.

As yet another embodiment, shown in FIG. 11, an active circuit layer 81 (for example, processor circuitry) may be formed on a second side surface of the electronic module. This embodiment thus utilizes side surface processing (for example, deposition of BLM pads) on two side surfaces of the stack, which may be performed as previously described herein for one side surface. Thin-film structure 41 (or passive film 71) is bonded to a first side surface, while an active circuit layer 81 is formed and deposited on a second side surface using the temporary workpiece and thin-film techniques described above, or using standard processor chips that have been thinned.

Advantageously, by providing an active circuit layer on a second side surface of the electronic module, the first surface active circuit layer 45 and associated electrically conductive trenches 47 (FIG. 7) may no longer be necessary (however, the transfer metallurgy pattern on each chip of the electronic module becomes more complex because it must connect to two edges (comprising the two side surfaces), as well as the I/O pads on the surface of each chip). Thus, an electronic module with a thin-film structure bonded to a first side surface, and an active circuit layer bonded to a second side surface is formed.

Furthermore, these techniques may be extended to provide various combinations of thin or conventional structures on more than two side surfaces of the electronic module. An electronic module with an attached structure such as separately formed side-surface metallization, is considered an "enhanced" electronic module.

As a further variation of the present invention, the electrical contacts on the electronic module may be formed by a plurality of different processes. Such processes are known in the art, and can be accomplished without lithography steps, thus eliminating the time, complexity, and expense associated therewith. For example, an electroplating process may be used to deposit BLM pads. Alternatively, an electroless plating process may be used. Specifically, the stack of chips could be dipped into a sequence of tanks, each to deposit a respective metal. The metals deposit preferentially on exposed conductors, so alignment of the transfer metals 15 with electrical contacts would be automatic. There is a limitation to this process, however. Transfer metal conductors are typically only 1–3 µm wide, so the electroless plating BLM pads would be very narrow.

As another variation, the electrical contacts on the electronic module may be electrically and mechanically attached to contacts on the thin-film structures, substrates or other electronic modules using techniques other than soldering. Alternative techniques would include, for example, the use of conductive polymers, polymer-metal composite pastes or anisotropic conductive polymers.

Further, depending on the electronic module, the function of active circuit layer 45 may vary. As one embodiment, chips 13 might comprise memory chips, in which case the circuitry may act as a memory buffer and a memory control overseeing memory allocation and utilization. Moreover, this function may be especially important should a specific chip 13 fail and need to be replaced, or spared, with another chip 13 in the electronic module 11 (see copending applications Ser. No. 08/120,876, entitled: "Integrated Multichip Memory Module, Structure and Fabrication," and Ser. No. 08/120,993, entitled: "Integrated Memory Cube, Structure and Fabrication").

Alternatively, active circuit layer 45 may provide a means to replace failed bits within one or more semiconductor chips of the electronic module (see copending application Ser. No. 08/220,086, entitled: "Semiconductor Stack Structures and Fabrication/Sparing Methods Utilizing Programmable Spare Circuit"). In another embodiment, the active circuitry may provide customer specific functions such as, for example, error correction, memory handshaking, or a self-test (see, for example, copending applications Ser. No. 08/120,876, entitled: "Integrated Multichip Memory Module, Structure and Fabrication," and Ser. No. 08/120, 993, entitled: "Integrated Memory Cube, Structure and Fabrication"). Thus, active circuit layer 45 may provide a wide variety of functions in support of the stack of integrated circuit chips 13.

The concepts and techniques of the present invention may be used to fabricate a variety of high-density electronic packages. Advantageously, as is known, higher density packaging results in shorter interconnections between components, yielding a higher speed, better performing electronic package.

Figure 12:
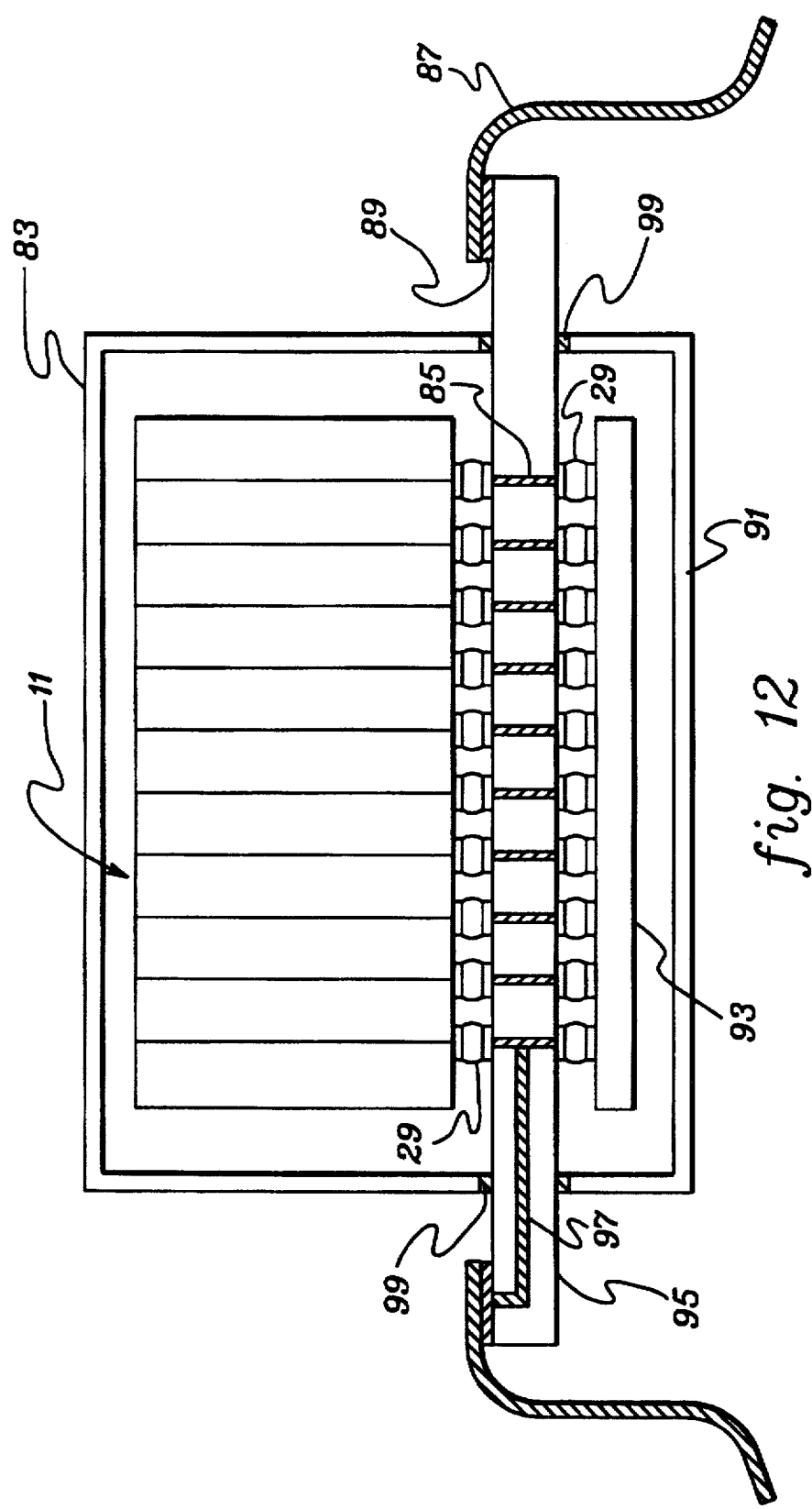
FIG. 12 is a cross-sectional view of a hermetically sealed electronic package containing an electron module and an associated logic/control chip.

As one embodiment, FIG. 12 shows an hermetically sealed electronic package. Included in the package is electronic module 11 which may be formed using the techniques previously described herein. The electronic module is then bonded to interposer 95, which may be formed, using conventional substrate fabrication techniques, of a material such as a ceramic. The interposer provides a variety of functions for the electronic package. First, electrically conductive vias 85 formed within the interposer connect the electronic module to an active circuit layer, such as logic/control chip 93.

The wiring within the interposer may be designed to facilitate the connection of "off-the-shelf" chips (such as a processor chip) with a predetermined contact pattern to an electronic module. Further, wiring 97 is provided within the interposer to connect the electronic package to external circuitry through electrical contacts 89 and leadframe connections 87. Optionally, the interposer may contain wiring (not shown) used to interconnect the various chips within the electronic module.

A hermetically sealed package is necessary in certain environmentally stressful environments. The use of a "thick" interposer, such as a ceramic substrate, enables the electronic package to be hermetically sealed. Hermeticity is achieved across the interposer using hermetic caps 83 and 91 in conjunction with hermetic seals 99. A portion of the package may be hermetically sealed by only encapsulating one element of the package such as the stack of chips (11). Optionally, non-hermetic sealing using, for example, plastic encapsulation may be used to protect the package from an external environment.

Figure 13:
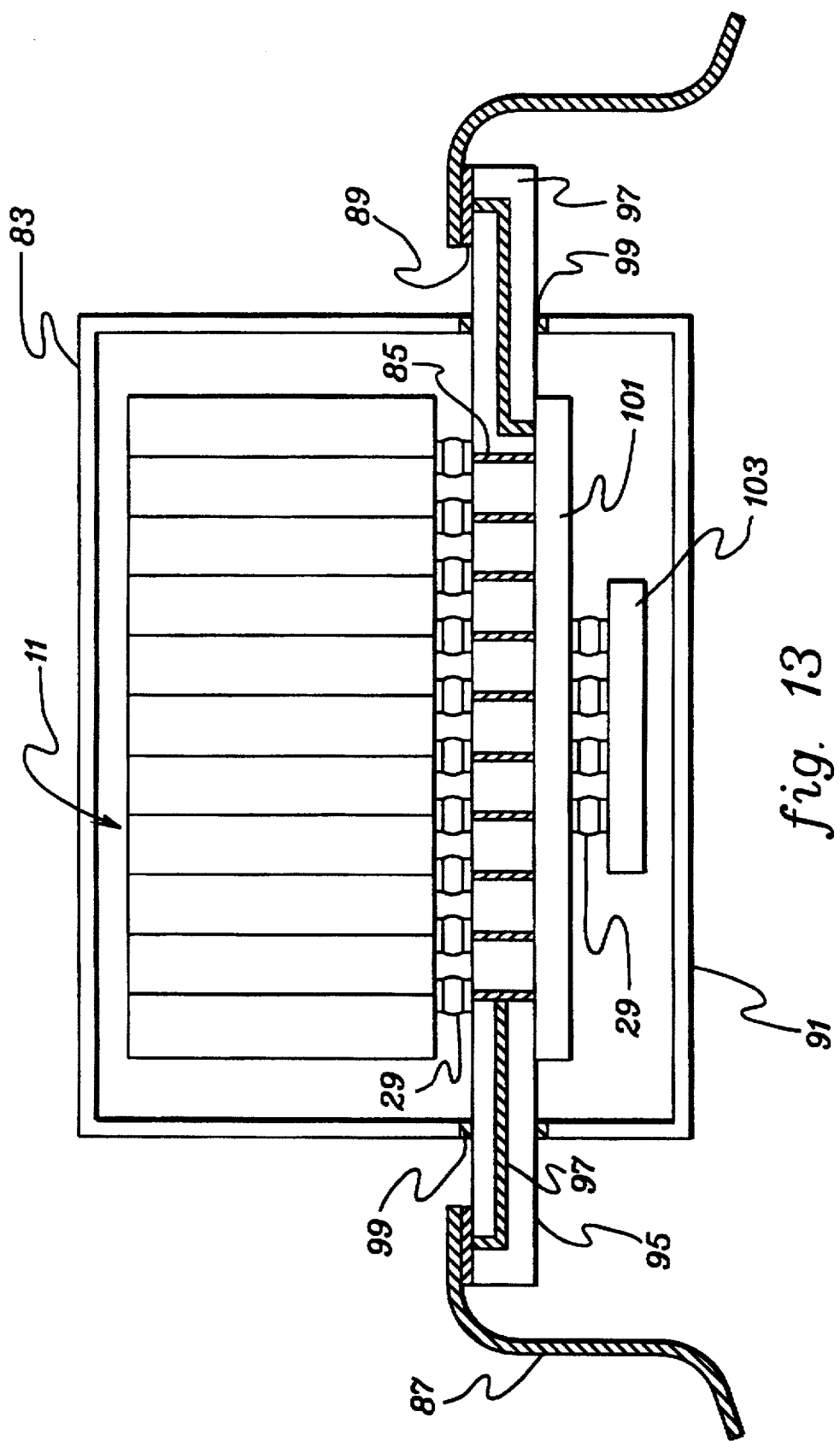
FIG. 13 is a cross-sectional view of the hermetically sealed electronic package of FIG. 12 having a thin-film metallization layer disposed between the interposer and the logic/control chip.

Another embodiment of a hermetically sealed electronic package is shown in FIG. 13. In addition to the structures previously recited, thin-film wiring/interconnect layer 101 is formed between the interposer and logic/control chip 103. Fabrication of layer 101 may be performed using the temporary workpiece techniques described herein. Layer 101 can be formed on a substrate, a flex or on a semiconductor chip. Functions provided by the thin-film wiring/ interconnection layer include redistributing and busing signals between the electronic module and the logic/control chip, and providing for simplified interconnection between the logic/control chip and external circuitry. Layer 101 allows "off-the-shelf" processor or logic control chips to be used in conjunction with an electronic module. Layer 101 assures that proper pads of chip 103 are connected to pads of the electronic module. If chip 103 is large enough, layer 101 can be included as an additional wiring level on chip 103 itself. Thus, the standard off-the-shelf microprocessor can be converted by layer 101 to interface with pads of an electronic module.

The additional layer of wiring/interconnection enables the use of a smaller logic/control chip because interconnection functions required of the logic/control chip have been simplified. As shown, in this embodiment, the physical area of the logic/control chip is smaller than the electronic module's side surface.

When hermetic sealing is used, it is important that the thin-film wiring/interconnection layer (101) be contained within the hermetic cap area, because hermeticity can not be achieved across the polymeric passivation associated with a thin-film layer. As shown, the thin-film wiring/interconnect layer and logic/control chip are both contained within the area of hermetic cap 91. Hermeticity may thus be achieved on both sides of interposer substrate 95, protecting the electronic module and logic/control chip. It should also be noted that the portion of the interposer that extends beyond the hermetic cap is unsealed.

Figure 14:
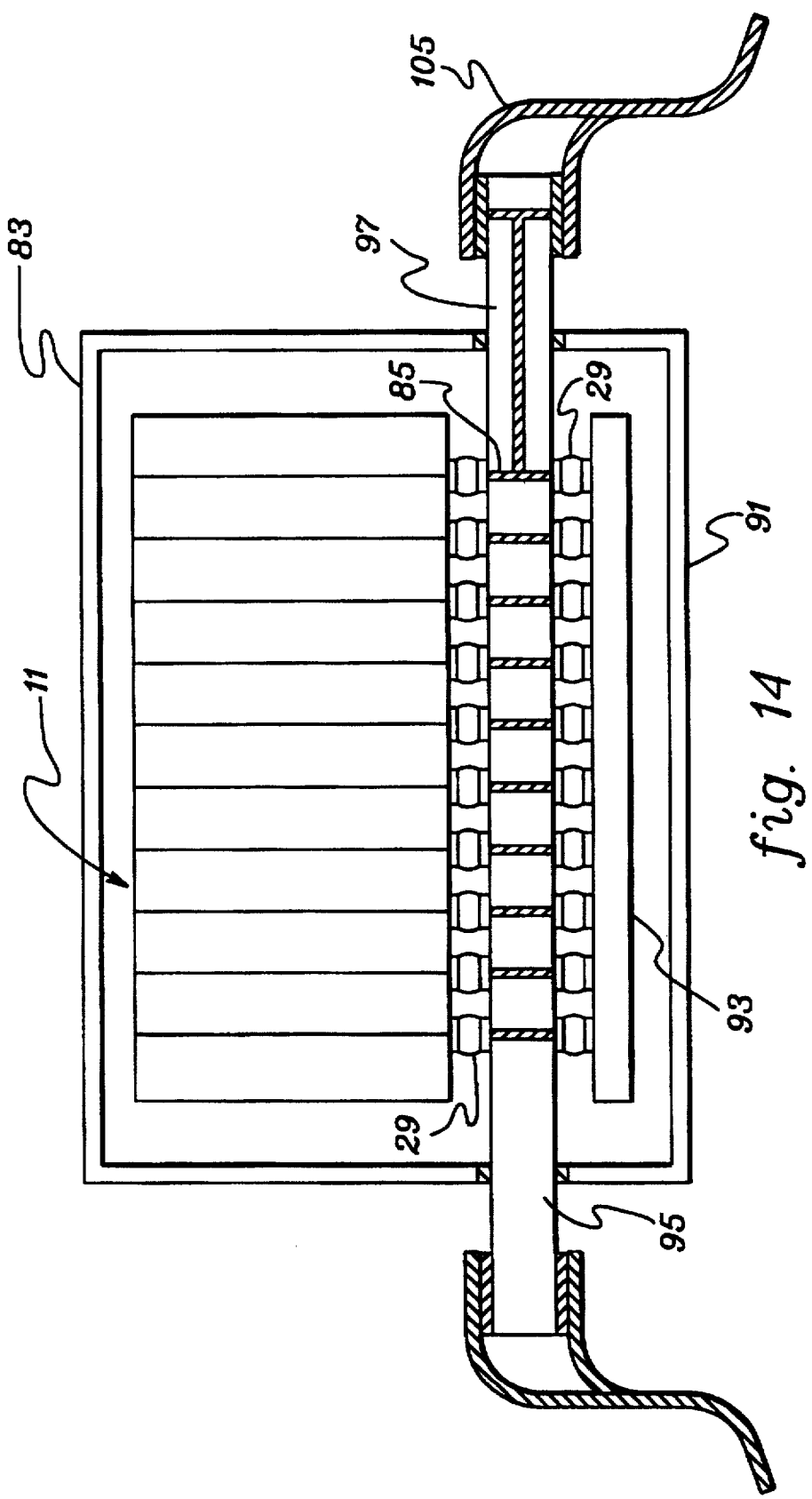
FIG. 14 is cross-sectional view of the hermetically sealed electronic package of FIG. 12 with external electrical connection provided by a two-sided leadframe.
Figure 15:
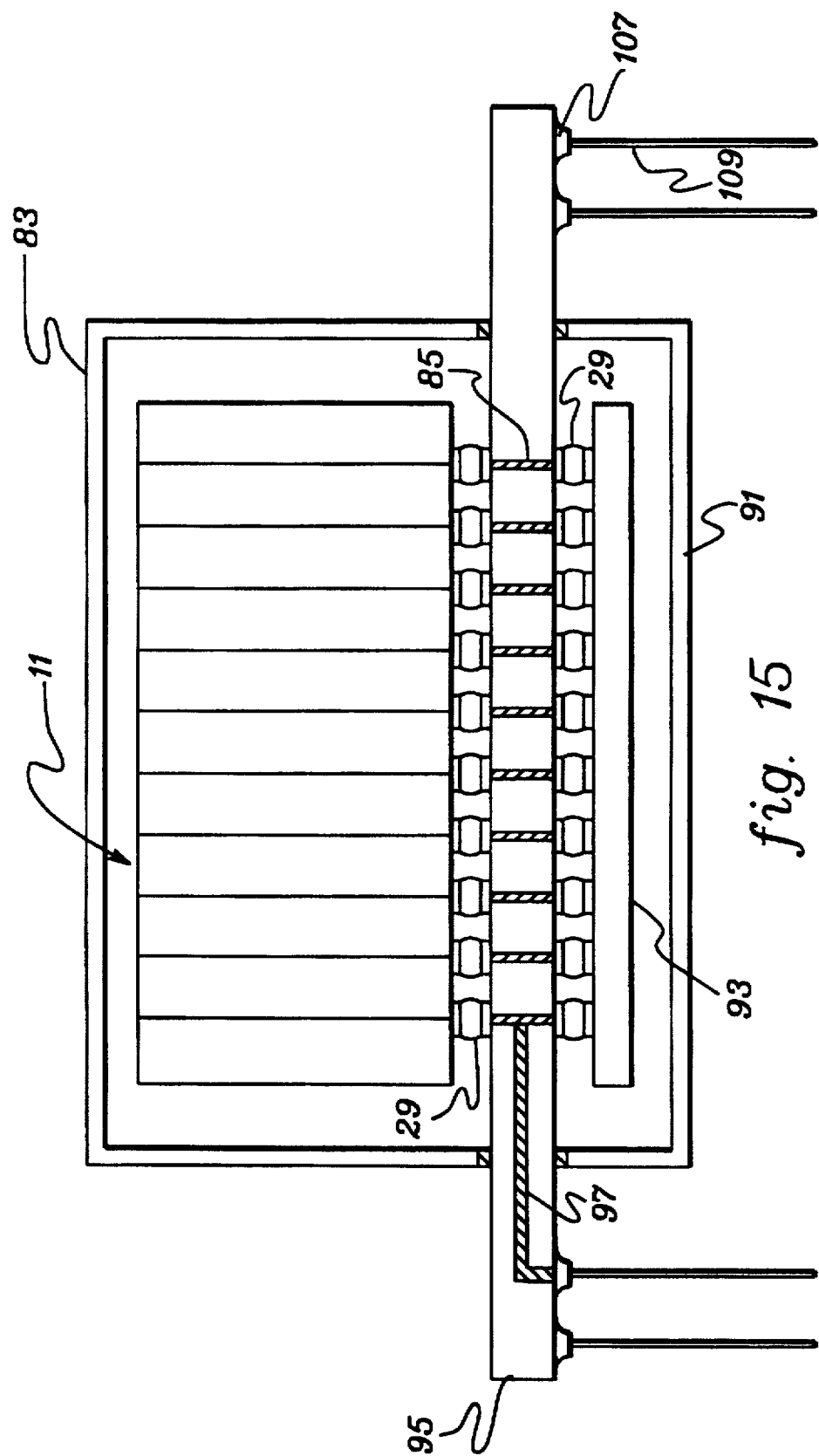
FIG. 15 is a cross-sectional view of the hermetically sealed electronic package of FIG. 12 with external electrical connection provided by input/output pins.

Further embodiments of hermetically sealed electronic packages are shown in FIGS. 14–15. Each of these embodiments includes alternate means for connecting the electronic package to external circuitry. In the embodiment shown in FIG. 14, two-sided leadframe 105 is used for connecting to external circuitry. As shown in FIG. 15, another embodiment includes I/O pads 107 and adjoining I/O pins 109 used to connect to external circuitry. Accordingly, simple, standard connectivity to external circuits is provided.

Other embodiments of high-density electronic packages are possible. For example, an electronic package may comprise a stack of memory chips. Associated therewith may be a logic/control chip, processor chip, or any active integrated circuit chip related to the function of the package. As one example, the memory may be primarily fast cache memory. Compared with current methods of packaging processors and associated cache memories, this invention provides significant advantages, including:

1. The ultra high density capability of the electronic package technology described herein allows much larger cache memories to be provided.

2. There is a significant performance advantage due not only to the higher density of the electronic module, but also due to the intimate interconnection between the electronic module and the processor. There are no intervening levels of packaging with all their associated delays and system performance impacts.

3. Because the cache memory is now in intimate contact with the processor, one can now envision a migration of level one ("L1") cache memory from the processor chip to the closely spaced memory chips of the electronic module. This simplifies the design and fabrication of the processor chip by substantially reducing its size and cost. Note: L1 cache memory is typically the fastest cache memory and is usually located on the processor chip.

4. This simplified processor chip coupled with its reduced size can now be fabricated at much higher yields per wafer.

5. An alternative for the standard processor having on-chip L1 cache and having a larger and slower level two ("L2") cache externally on separate modules is a processor and an electronic module directly connected together, the electronic module having both L1 and L2 memory in one package. The integration of L1 and L2 caches is made possible by the reduced wiring delay, improved access time, higher hit ratio, and larger size of the memory in the closely coupled electronic module.

6. Main memory, which is even larger and slower than L2 cache, may also be incorporated into an electronic module coupled to a processor chip. Again, the tight integration of memory and processor increases speed, and overall density of the system.

7. All of these advantages cumulatively translate directly into lower product cost and higher system performance, thereby enabling higher profit margins compared with the current methods for providing this function to the end user.

High speed processors generate a lot of heat that must be removed. The present invention provides several packaging embodiments to remove that heat notwithstanding the closely integrated electronic module. The invention also provides several embodiments for interconnecting the processor, the electronic module, the package and an external circuit board. Embodiments of such electronic packages are described in detail with respect to FIGS. 16–26 below.

Figure 16:
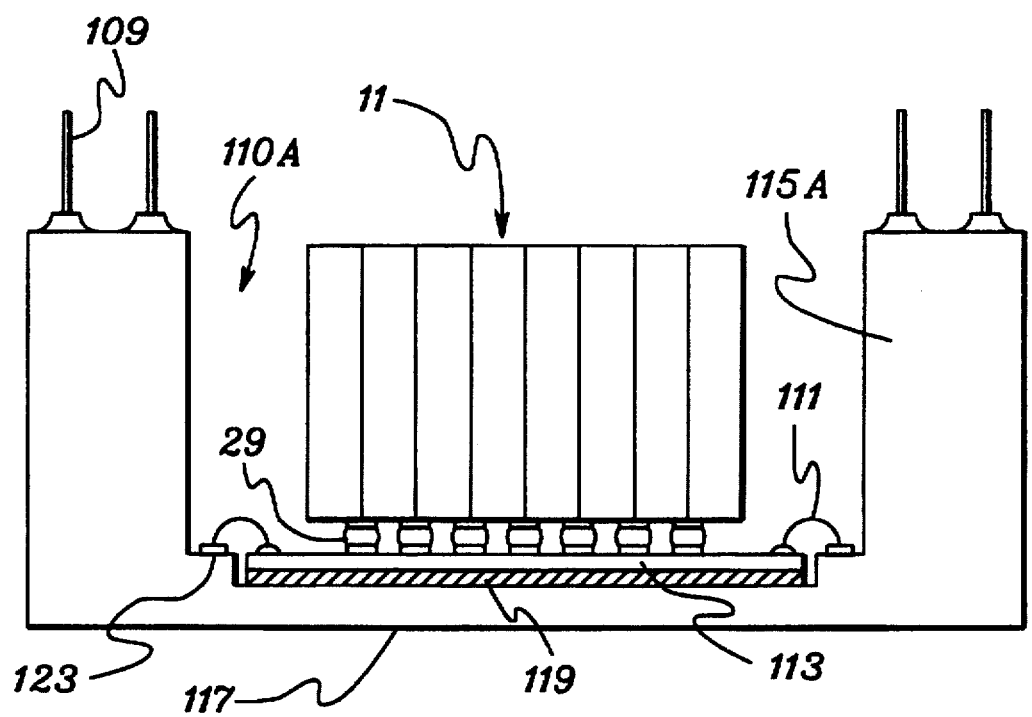
FIG. 16 is a cross-sectional view of an electronic package having an electronic module in a "loaf" format bonded to a processor, both contained within a city substrate.

As one embodiment, FIG. 16 illustrates a processor/fast cache package. Processor chip 113 is 30 die bonded to substrate 115A for thermal management and mechanical support. Electrical connectivity between the processor and the substrate (115A) is provided by wirebonds (111) connecting the processor to substrate wirebond pads 123. Within the substrate, signals are interconnected and then routed externally through input/output (I/O) pins 109. Processor chip 113 is also electrically connected to electronic module 11 by solder bump (29) bonding. Signals entering the electronic package at I/O pins 109 pass through conductive wiring (not shown) contained within substrate 115A and wirebonds 111 to processor chip 113 and electronic module 110.

Structurally, electronic module 11 and processor 113 are completely recessed within cavity 110A in cavity substrate 15A. When mounted to, for example, a printed circuit board, top surface 117 of cavity substrate 115A covers and protects the interior components. Heat can be removed from the package by, for example, the inherent heat radiating ability of substrate 115A, or the addition of cooling fins (not shown) on top surface (117) of substrate 115A. The packaging scheme provides the ability to remove heat from the processor despite the closely integrated electronic module.

Figure 17:
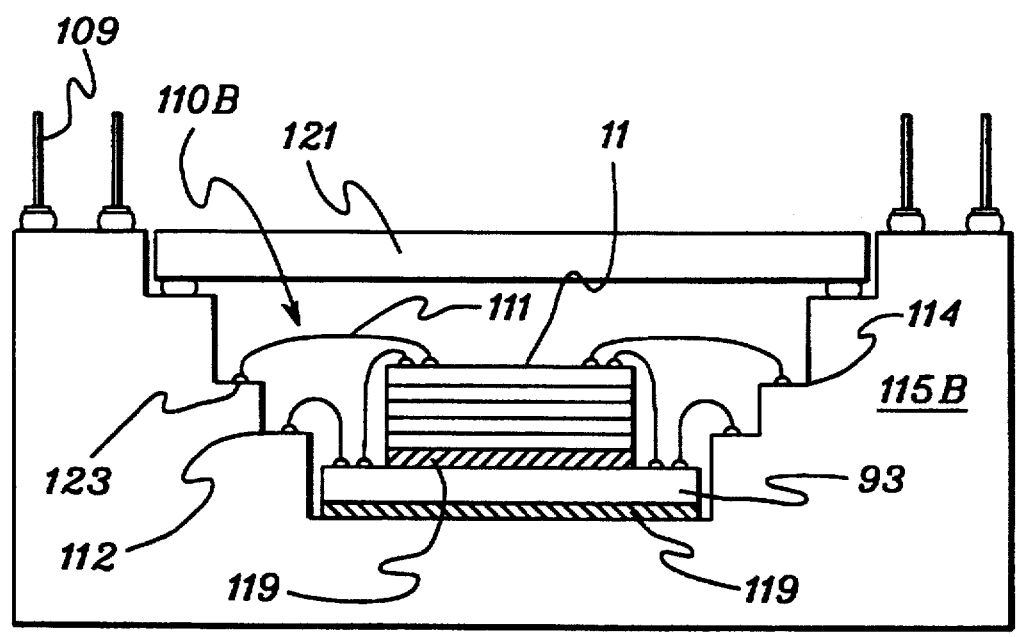
FIG. 17 is a cross-sectional view of an electronic package an electronic module fabricated in a "pancake" format bonded to a logic/control chip, both wirebonded to various wirebond pad levels with a cavity substrate.

Another electronic package is shown in FIG. 17. Logic/control chip 93 (used for memory management) is bonded to cavity substrate 115B that removes heat and provides mechanical support. Wirebonds 111 electrically attach logic control chip 93 to substrate wirebond pads 123. Electronic module 11 is bonded to the logic/control chip on an end surface using die attach material 119. Additional wirebonds 111 electrically connect pads on the opposite end surface of the electronic module to both the logic/control chip and the substrate (115B). Wiring within substrate 115B interconnects I/O pins 109, electronic module 11, and logic/control chip 93 to form an integrated memory controller/memory package.

A unique organization of wirebonds interconnect electronic module 11, logic/control chip 93 and substrate 115, all being contained within cavity 110B of cavity substrate 115B. As shown, wirebond pads 123 are located in various positions within the substrate's cavity to facilitate simplified wirebonding between structures. For example, first wirebond pad level 112 is closest to the logic/control chip and second wirebond pad level 114 is closest to the electronic module. Wirebonds are routed along the most efficient path between a structure and a corresponding wirebond pad level.

After fabrication is complete, lid 121 may be attached, covering the cavity and protecting the elements within. As an enhancement, a thermally conductive compound (see, for example, FIG. 23) may be used to join the lid and the electronic module. In addition, the lid may be used to hermetically or non-hermetically seal the electronic package. A further enhancement entails the attachment of cooling fins (see, for example, FIG. 23) on the top-side of the substrate, resulting in a further improvement to the thermal management of the electronic module.

Figure 18:
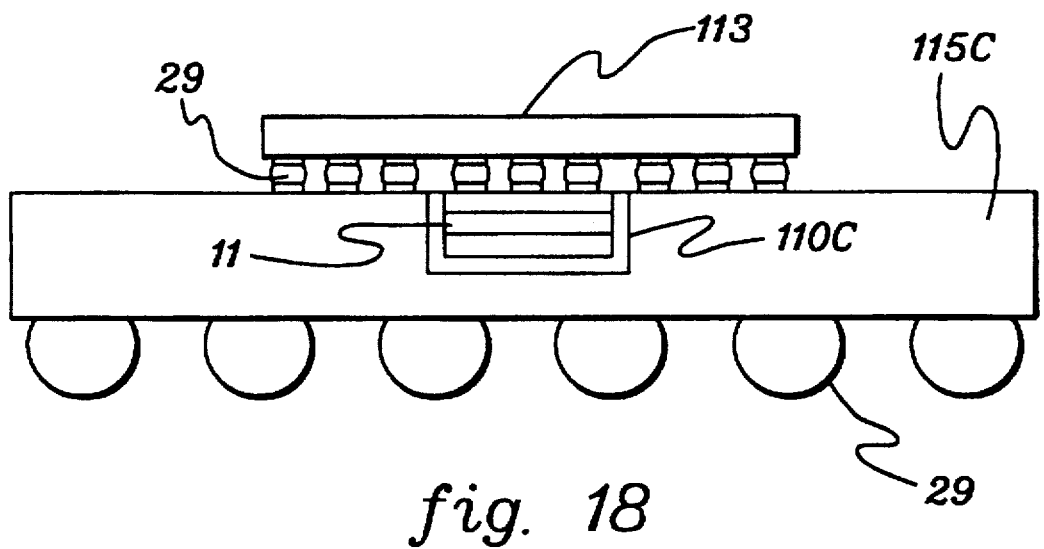
FIG. 18 is a cross-sectional view of an electronic package having a "pancake" format electronic module recessed flush within a substrate, with a processor chip being solder bump bonded to both the substrate and the electronic module.

FIG. 18 represents an embodiment of the present invention in which solder bump connections are used throughout. An end surface of a "pancake" format electronic module 11 is flush mounted within cavity 110C of cavity substrate 115C, and the resulting planar surface is solder bump bonded to processor chip 113. Alternatively, electronic module 11 is solder bump bonded to chip 113 and then chip 113 is solder bump bonded to the substrate 115C with electronic module 11 within cavity 110C. The substrate contains internal wiring (not shown) that connects the processor to the solder bump connections on the bottom surface of the substrate for connection to external circuitry. Heat is removed through a top lid thermally joined to chip 113 by thermal grease or thermal bonding.

Figure 19:
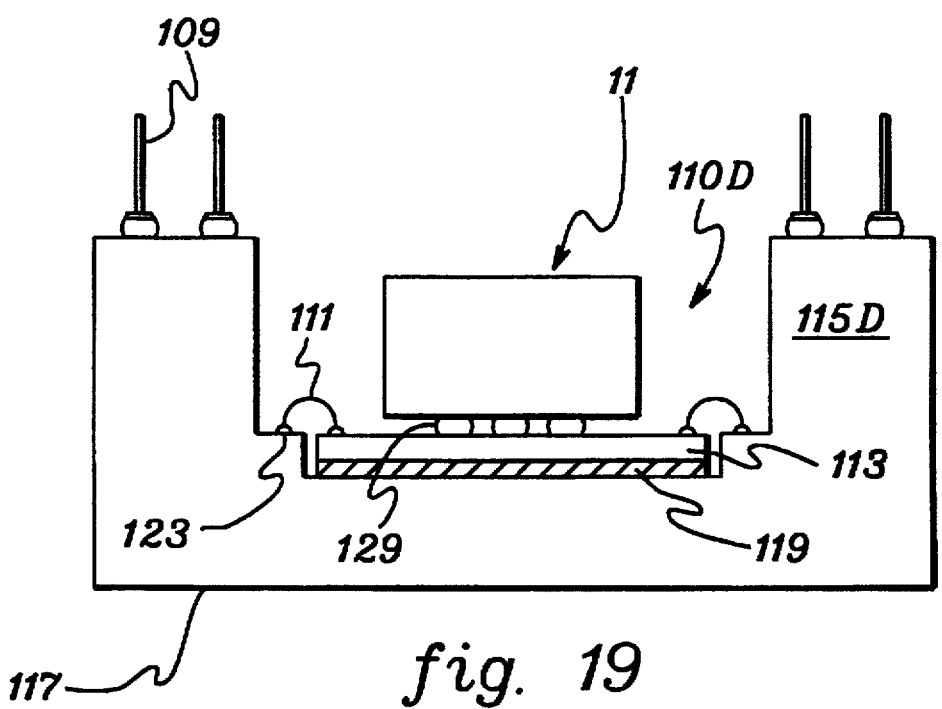
FIGS. 19 and 20 are cross-sectional and top-schematic views respectively, of an electronic package wherein an electronic module is bonded by solder bumps to both a flush mounted processor chip and a substrate.
Figure 20:
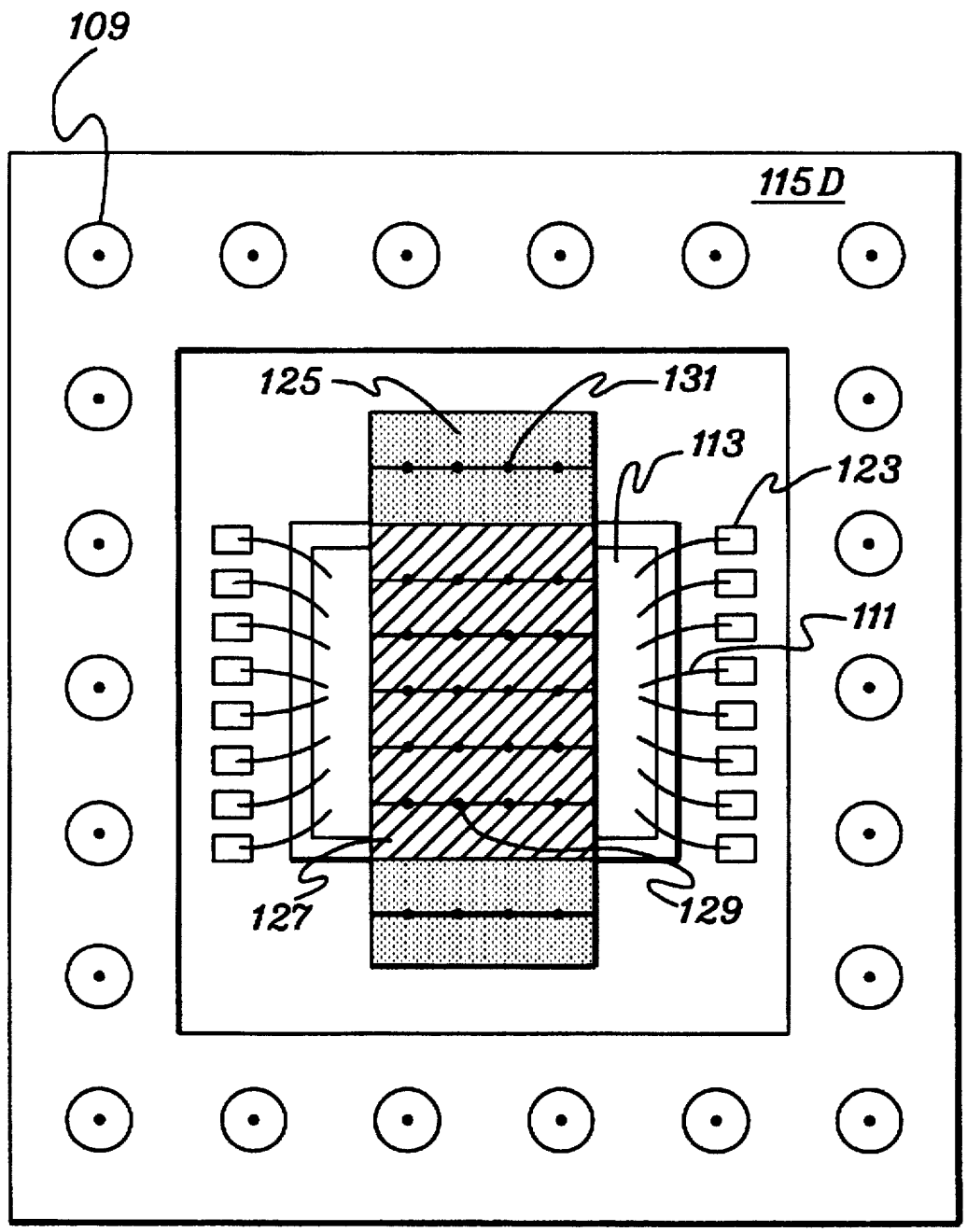

Yet another embodiment of the present invention is illustrated in FIGS. 19–20. In this embodiment, both dynamic random access memory (DRAM) chips 125 and static random access memory (SRAM) chips 127 are contained within electronic module 11 (FIG. 20). The processor chip is flush mounted within the cavity substrate (115D) so that the SRAM chips may, for example, act as a fast cache, and be solder bump (129) bonded directly to processor 113, while the DRAM chips may, for example, act as main memory, and be solder bump (131) bonded to the substrate (Note: Although solder bump connections 129 and 131 would not be visible in a top view, they are shown in the top schematic view of FIG. 20 for clarity). The processor chip and the substrate are electrically connected by wirebonds 111 leading from the processor to wirebond pads 123. Advantageously, this embodiment incorporates both a processor and multiple memory levels into a single, ultra-high density electronic package.

A logic/control chip attached to an electronic module may provide a variety of memory management functions and capabilities. These may include, as previously discussed, for example, error correction, memory handshaking, automatic chip sparing within the stack, and/or buffering (see copending application Ser. No. 08/220,086, entitled "Semiconductor Stack Structures and Fabrication/Sparing Methods Utilizing Programmable Spare Circuit."). Examples of such arrangements are shown in FIGS. 21–23.

Figure 21:
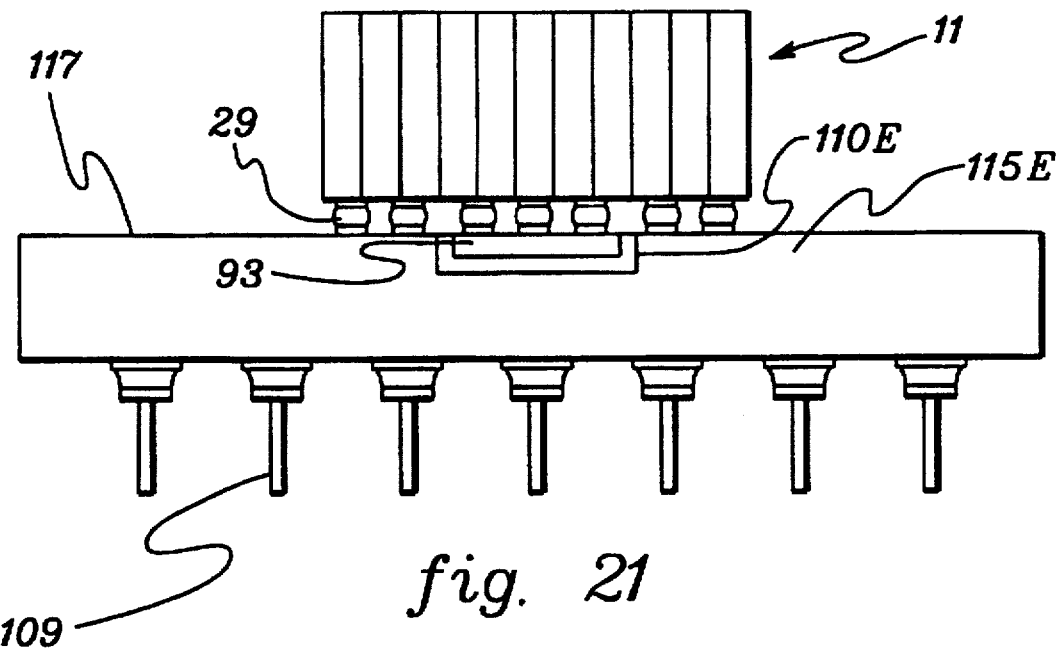
FIG. 21 is a cross-sectional view of an electronic package having an electronic module bonded to both a substrate and a flush mounted logic/control chip.

FIG. 21 illustrates an embodiment of the present invention wherein logic/control chip 93 is flush mounted within cavity 110E of cavity substrate 115E. This enables electronic module 11 to be simultaneously solder bump bonded (29) to both the logic/control chip and the substrate. A thin-film wiring/interconnect layer (not shown) is optionally deposited between electronic module 11 and both logic/control chip 93 and substrate 115E. This layer provides electrical interconnection between the electronic module, active integrated circuit chip and substrate. In forming such a layer, the temporary workpiece techniques previously described herein, or conventional side-face metallization methods may be employed.

It should be generally noted that other combinations of flush mounted semiconductor structures (e.g., chips and/or electronic modules) bonded to various other semiconductor structures are possible.

Figure 22:
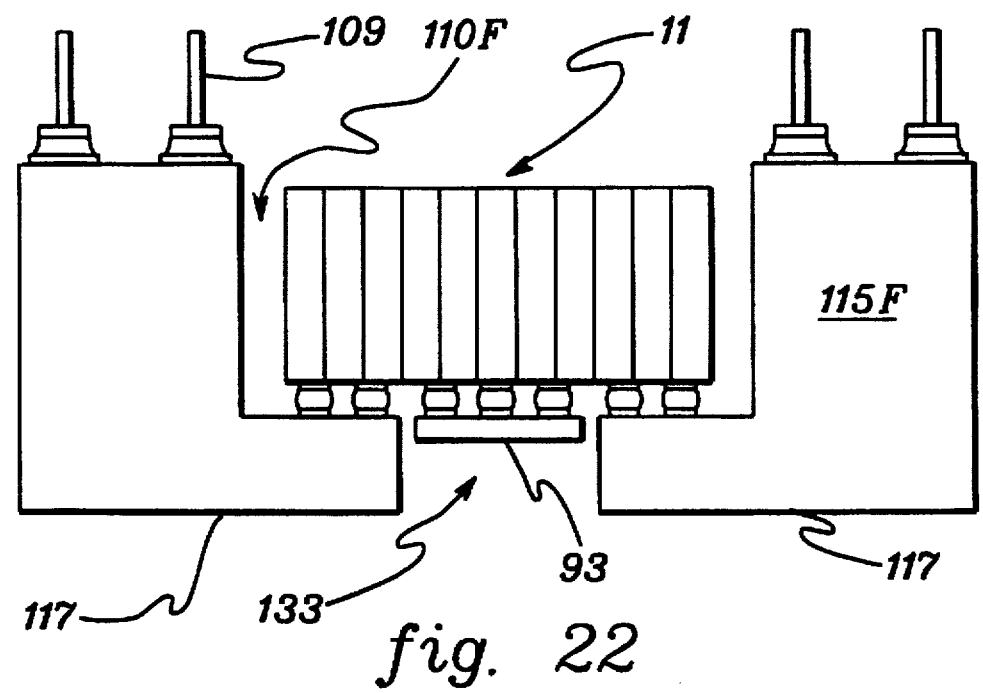
FIG. 22 is a cross-sectional view of a three-dimensional electronic package wherein an electronic module is bonded to both a substrate and a logic/control chip which is contained within an opening in the substrate.
Figure 23:
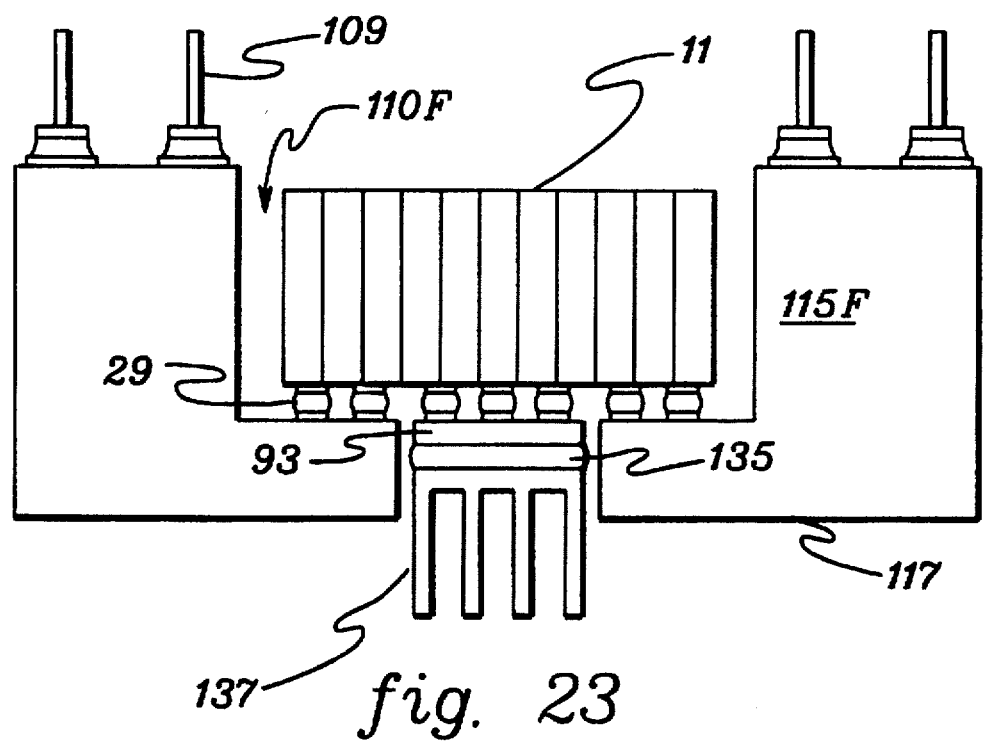
FIG. 23 is a cross-sectional view of the electronic package of FIG. 22 having a heat sink added to the logic control chip for enhanced thermal management of the package.

The embodiment of FIG. 22 includes cavity substrate 115F having both cavity 110F and opening 133. This opening enables (1) enhanced thermal management; (2) a wider range of electronic module build options; and (3) independent subcomponent removal and replacement. In addition to the inherent heat transfer provided by the opening, it may be used to add low cost thermal management technologies. Thermal management is controlling the temperature of the device. It may include providing or removing heat. Shown in FIG. 23 is one such technology. Heat sink 137 is attached to the back side of logic control chip 93 using thermal compound 135 (such as thermal grease). The opening also permits various alternative build options to be exercised. For example, a variety of user selectable logic/control chips, or other types of chips (e.g., processor), may be selectively attached to a standard electronic module. Further, the opening permits the logic/control chip to be removed for repair and/or replacement in a simplified manner. In a similar manner to the embodiment of FIG. 22, a thin-film wiring/ interconnect layer (not shown) may be used to interconnect substrate 115F, electronic module 11 and logic/control chip 93.

Figure 24:
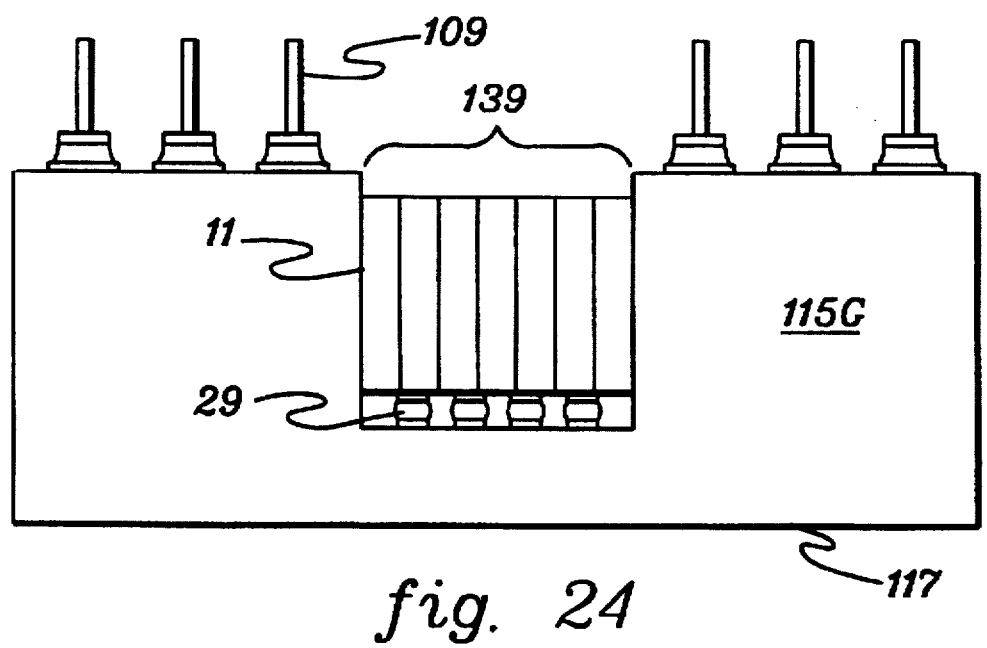
FIGS. 24 and 25 are side and top views, respectively, of an electronic package having cooling channels provided within the substrate to enhance thermal Management of the package.
Figure 25:
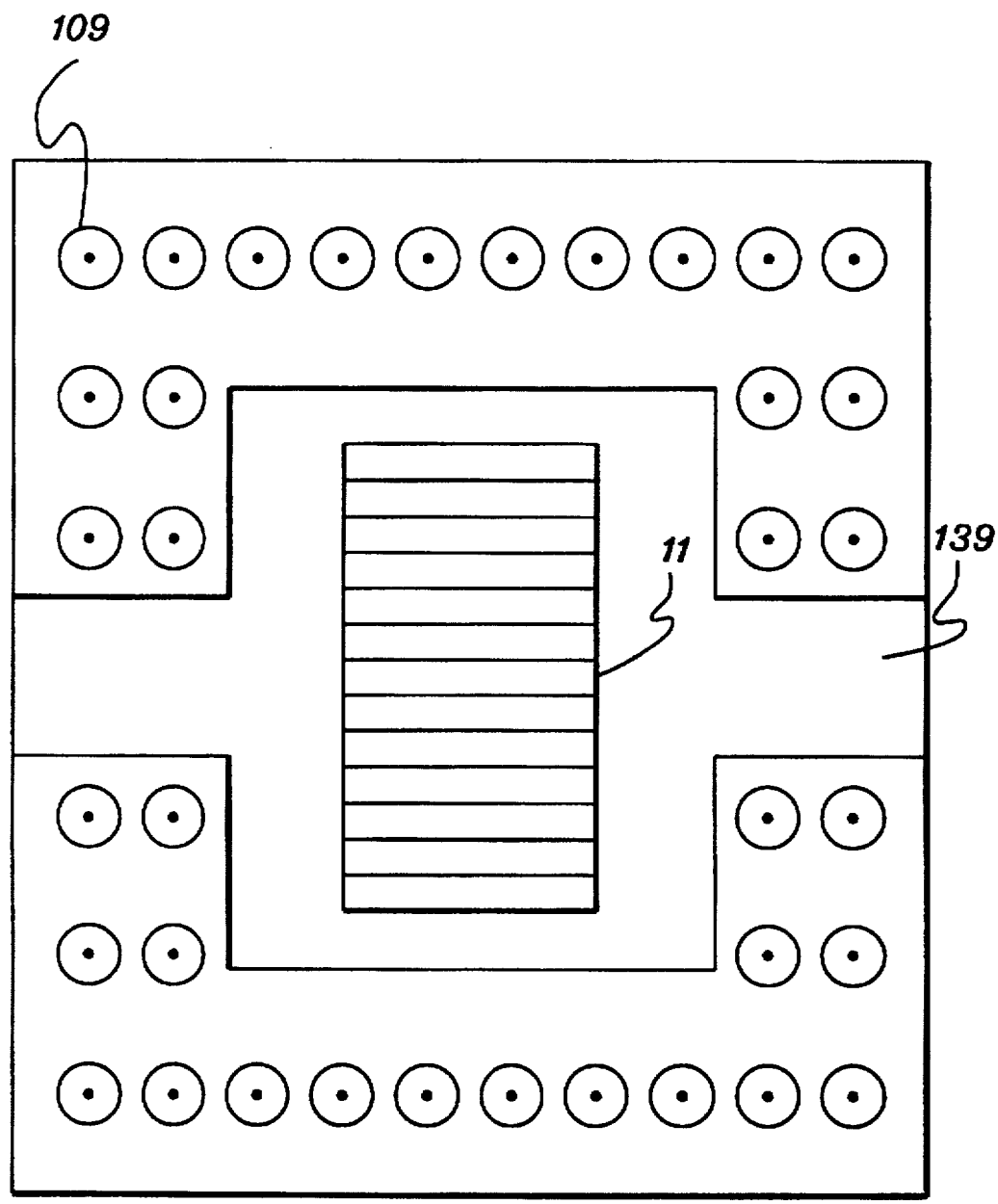

Yet another embodiment incorporating advanced thermal management is shown in the two views presented in FIGS. 24–25. Cooling channel 139 is fabricated in the substrate, providing for a direct gas or fluid coolant flow pathway around the electronic module. Supplemental thermal management may be provided by adding additional coolant flow channels in the substrate and/or attachment of heat transfer fins to the electronic module.

Figure 26:
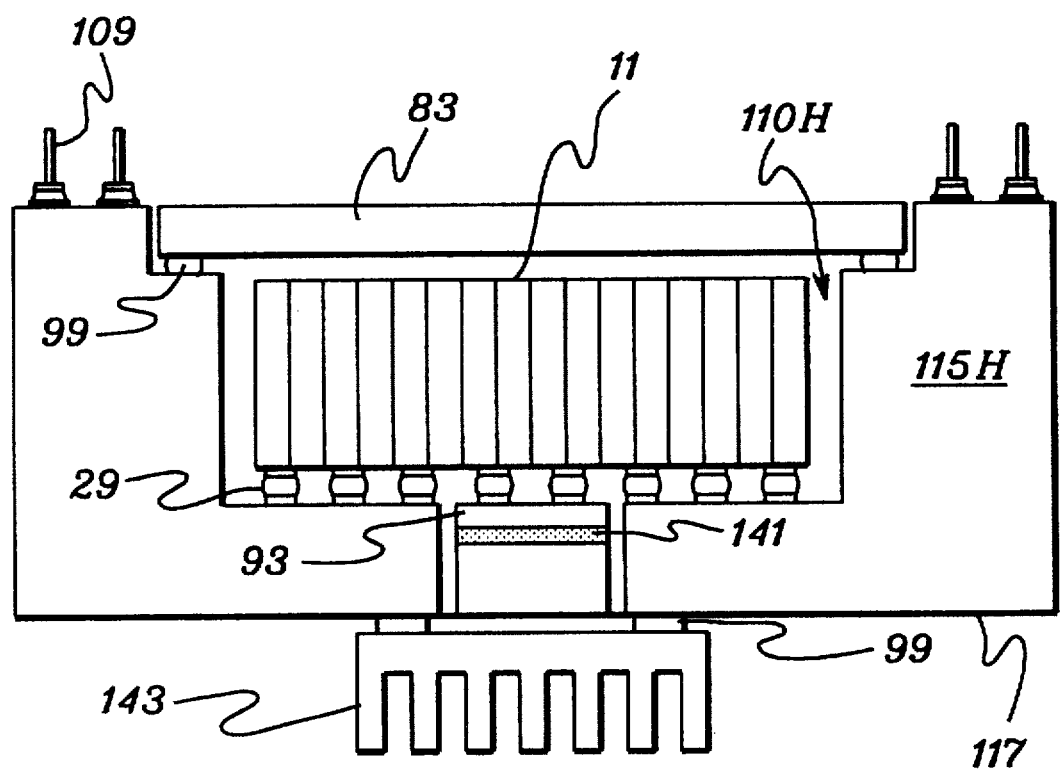
FIG. 26 is a cross-sectional view of a hermetically sealed electronic package with enhanced thermal management.

A hermetically sealed embodiment of the present invention incorporating a heat sink is shown in FIG. 26. Hermetic seals 99 are disposed between heat sink 143 and cavity substrate 115H, and between hermetic cap 83 and substrate 115. Thermal management of the electronic module is provided by heat sink 143 attached to logic control chip 93 (by thermal compound 141), as well as heat transfer through hermetic cap 83. In a further embodiment, cooling fins could be attached to the hermetic cap or a thermal compound could be applied between the electronic module and the hermetic cap (neither shown). In yet another embodiment, if a hermetic seal is not required, and only mechanical protection for the components is, the hermetic seal may be replaced with a non-hermetic seal utilizing, for example, a high temperature epoxy.

The close integration of an electronic module(s) comprising memory chips with a processor chip permits a variety of different memory organizations and structures. Particularly, L2 cache memory, L2 cache memory and main ("L3") memory may be selectively disposed within an electronic module (or multiple electronic modules) electrically and mechanically coupled to the processor chip. Other chips associated with the processor may be added to the combination of processor and electronic memory module(s) providing further functions (for example, bus controllers, interface chips, or graphics controllers). Accordingly, a complete "computer unit" is formed in one package. Embodiments of such computer units are described in detail with respect to FIGS. 27–32 below.

Figure 27:
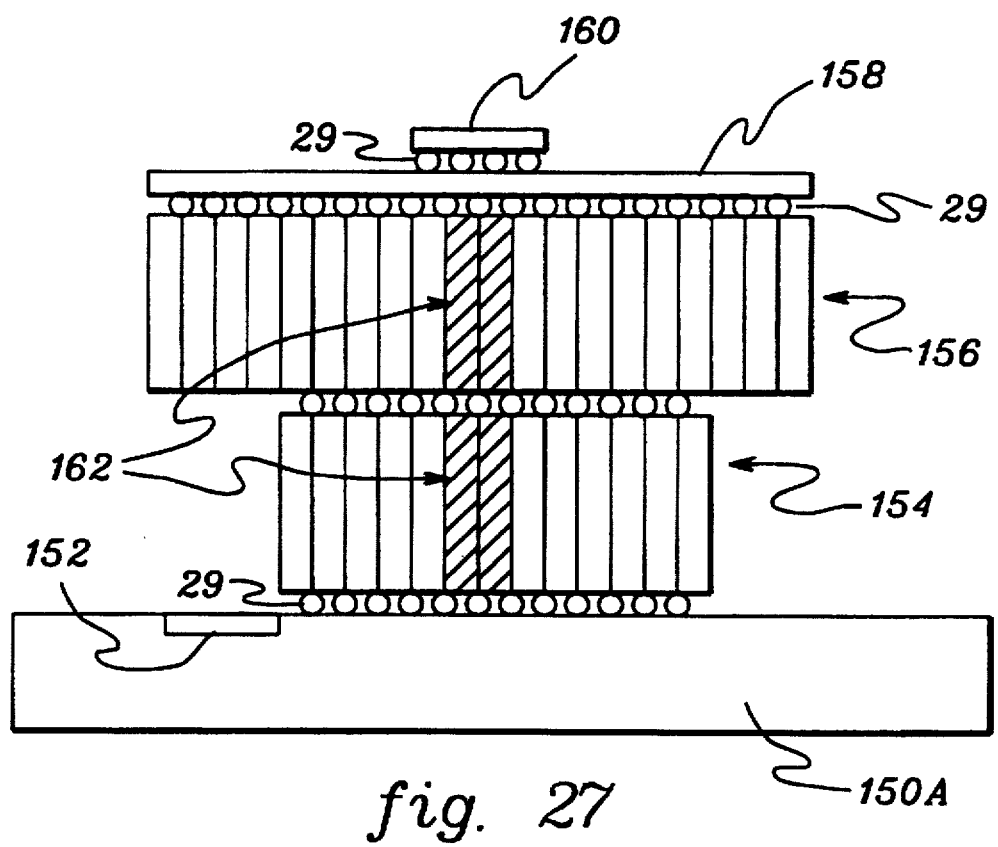
FIG. 27 is a cross-sectional view of a computer unit with multiple memory levels contained in multiple electronic modules in accordance with the present invention.

As one embodiment, FIG. 27 illustrates a computer unit containing multiple levels of cache memory and a main memory. Processor 150A contains cache memory controller 152 and L1 cache memory (not shown). The cache controller manages both L1 (on-chip) and L2 (off-chip) cache memory. The L2 cache memory is provided by electronic module 154, which includes a plurality of memory chips. Interconnection between the electronic module and the processor is provided by solder bumps (29).

A second electronic module (156) including main memory chips (for example, DRAMs) is electrically and mechanically coupled to electronic module 154 by solder bumps. The solder bumps (29) electrically and mechanically bond to contacts disposed on a substantially planar surface of each electronic module. Formation of these electrical contacts may be performed using standard techniques for forming T-connects or through deposition of BLM pads as described herein.

An interposer substrate (158) is electrically and mechanically bonded (using solder bumps) to a top surface of main memory electronic module 156.

Further, main memory controller chip 160 is solder bump bonded to the top surface of interposer 158.

A novel method of electrical interconnection between the elements is provided within the computer unit shown in FIG. 27. Bussing chips 162 are disposed within both electronic modules. These chips provide a direct electrical connection from processor 150A through both sets of electronic modules up to, and through, interposer substrate 158 to memory controller 160. The memory controller then electrically communicates with the chips comprising main memory module 156 through electrical interconnections provided in interposer substrate 158. The resulting computer unit therefore includes: a processor chip having an integral L1 cache memory and L1/L2 cache memory controller; an L2 cache memory provided on an electronic module; a main memory provided on another electronic module; a main memory controller chip; and a combination of bussing chips and an interposer substrate closely interconnecting and integrating the entire computer unit.

It should be noted that the majority of solder bump connections between the two electronic modules merely provide mechanical support. The only solder bumps disposed therein which provide electrical contact are those attached to busing chips 162.

Figure 28:
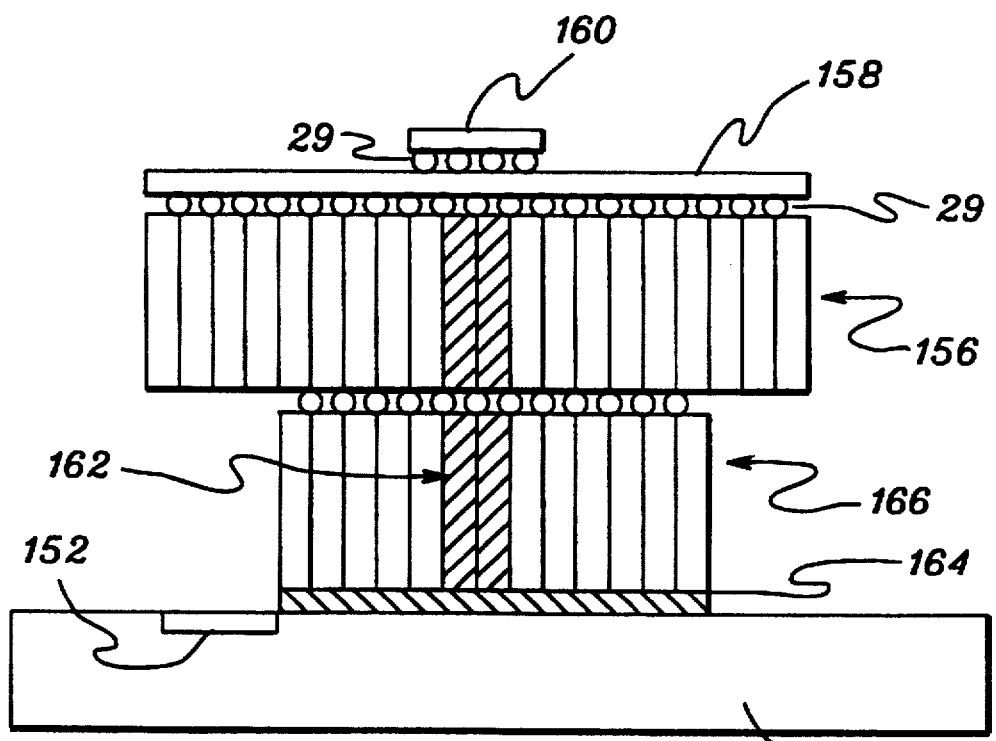
FIG. 28 is a cross-sectional view of the computer unit of FIG. 27 having a high I/O interconnect electrically coupling the processor to an electronic module.

In another embodiment shown in FIG. 28, processor 150B has been provided without an on-chip L1 cache memory. Accordingly, electronic module 166 has been provided containing both L1 and L2 cache memories. It should be noted that this may comprise separate L1 and L2 cache memory circuits or one memory which serves as a very large L1 cache memory eliminating the need for L2 cache. This is possible because of the close integration of memory module 166 to processor chip 150B.

One of the advantages of on-chip cache memory is the large number of interconnections available between processor and memory, permitting wide words. The present invention provides comparable or greater total number of interconnections between the processor chip and the integrated L1/L2 cache memory module. High density Input/Output ("I/O") interconnect 164 is provided interconnecting the L1/L2 electronic module with the processor chip. (See, for example, U.S. Pat. No. 5,202,754, "Three-Dimensional Multi Chip Packages and Method of Fabrication," issued Apr. 13, 1993 and previously incorporated herein by reference). Integral L1 /L2 cache memory 166 is controlled by cache memory controller 152 provided on the processor chip.

The remainder of the computer unit shown in FIG. 28 is similar to that shown in FIG. 27. Specifically, an L3 main memory module (156) is provided, and solder bump bonded to integral L1 /L2 cache memory module 166. Further, both interposer substrate 158 and main memory chip controller 160 have been provided, connected to the processor by busing chips 162 disposed within both electronic modules.

Figure 29:
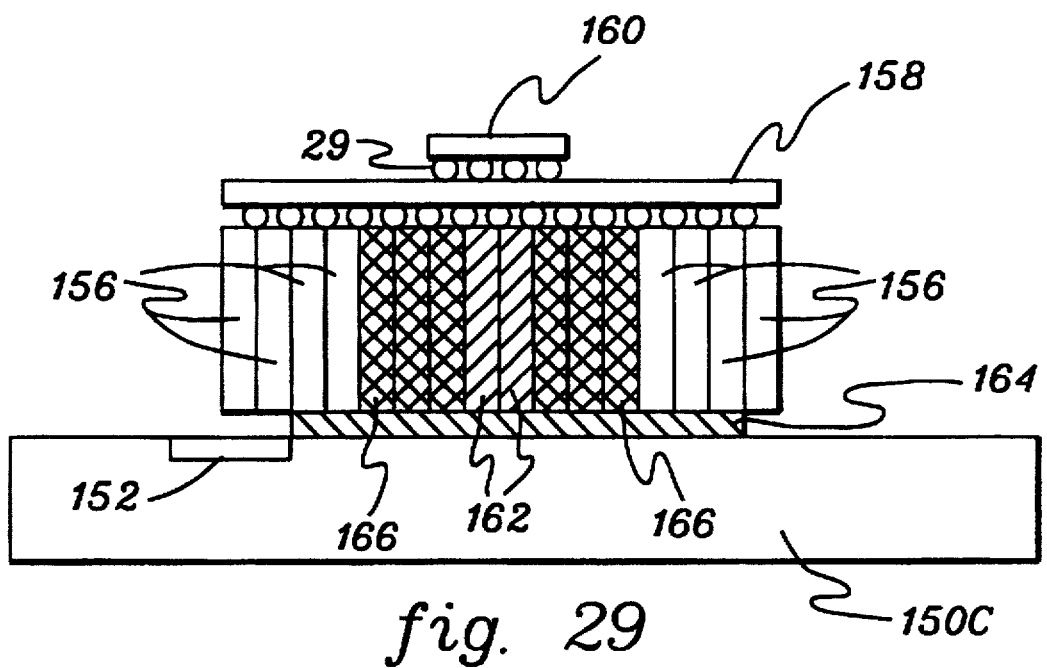
FIG. 29 is a cross-sectional view of a computer unit of the resent invention having three levels of memory contained in a single electronic module.

The embodiment of the present invention shown in FIG. 29 represents a computer unit containing single electronic module 157 having three levels (L1, L2 and L3) of memory. In particular, main memory chips 156 (for example, DRAMs) are grouped at "opposite" ends of the electronic module. Cache memory chips 166 (for example, high speed SRAMs) are grouped together "inside" the main memory chips. As in the previous embodiments, bussing chips 162 are disposed in the center of the stack of chips comprising electronic module 157. Other organizations of various types of chips within the electronic module are also possible. Again, as in the previous embodiments, interposer substrate 158 and memory control chip 160 are included within the computer unit.

Interconnection between processor 150C and combined L1/L2 memory is provided by high Input/Output ("I/O") interconnect 164. As shown, no direct connections exist between the main memory chips (156) and processor chip 150C. The computer unit is organized in this manner because all connections to main memory chips 156 take place through high I/O interconnect 164, bussing chips 162, main memory controller 160 and interposer substrate 158.

Figure 30:
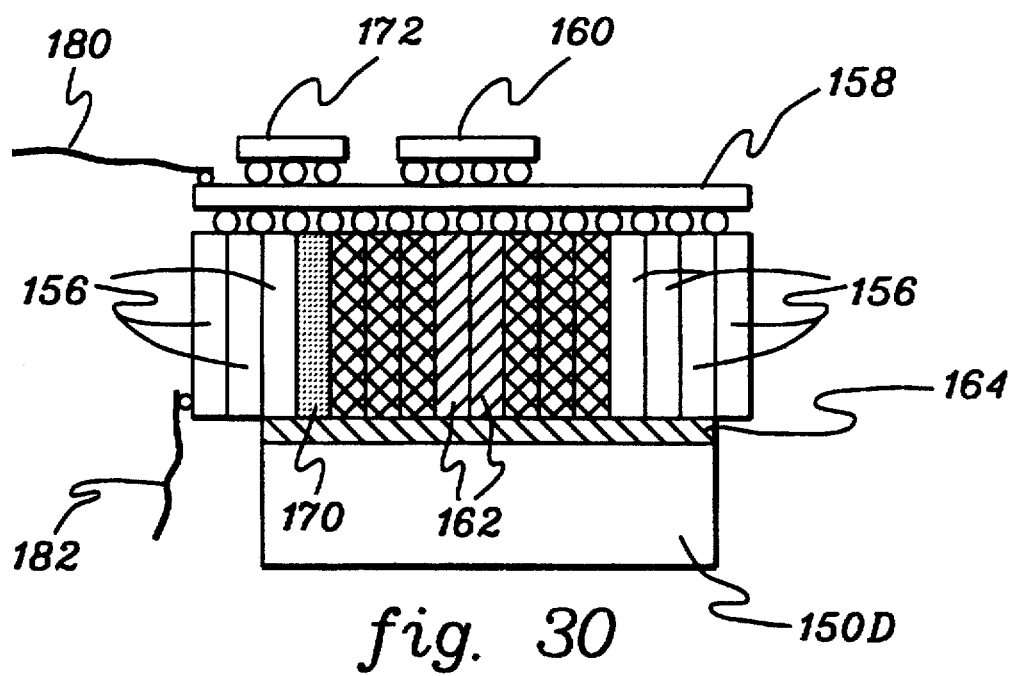
FIG. 30 is a cross-sectional view of the computer it of FIG. 29 having a PCI bus controller chip as well as an interface cable for connection of the computer unit to the PCI bus.

FIG. 30 represents an enhancement to the computer unit of FIG. 29, however, the additional features shown may be incorporated into the other embodiments described herein. Peripheral Component Interconnect ("PCI") bus controller 172 has been mechanically and electrically coupled to the interposer substrate 158 using solder bump bonding. Wiring within the interposer substrate connects PCI bus controller 172 to appropriate elements such as processor 150D and the memory chips of electronic module 159. For example, as shown, bussing chip 170 has been added to the electronic module to connect PCI bus controller 172 (connected through interposer substrate 158) to processor chip 150D. It will be noted, as shown, that the high I/O interconnect (164) has been extended to accommodate processor connections to busing chip 170.

An interface cable (180) is mechanically and electrically connected to the interposer substrate (158). This cable provides electrical connection from PCI bus controller 172 to a PCI bus (not shown, external to the computer unit). The interposer substrate provides appropriate connections between the PCI bus controller and the interface cable. Similarly, other types of interface chips could be used. For example, a graphics controller could be substituted for the PCI bus controller integrating a graphics function within the computer unit. The interface cable would then provide external connection to the graphics controller. Alternatively, the graphics controller and the PCI bus controller could both be attached to the interposer substrate providing even more functions within the computer unit. In fact, any integrated circuit chip, or combination of integrated circuit chips, useful in conjunction with a computer unit may be implemented using the structures and methods described herein.

Second interface cable 182 is shown attached to an end surface of electronic module 11. The second interface cable may electrically attach directly to one of the chips within the electronic module, or to an end or side surface metallization pattern (not shown). Metallization may be deposited using traditional techniques or those described herein.

Second interface cable 182 may provide additional I/O functions for the computer unit, or may serve as an additional source of power and grounding. This may be necessary, to alleviate the need to distribute large amounts of power through the processor chip to the various componentry attached thereto. By supplying the power directly to the electronic module, processor chip 150D can have reduced wiring, and requires less heat dissipation.

Figure 31A:
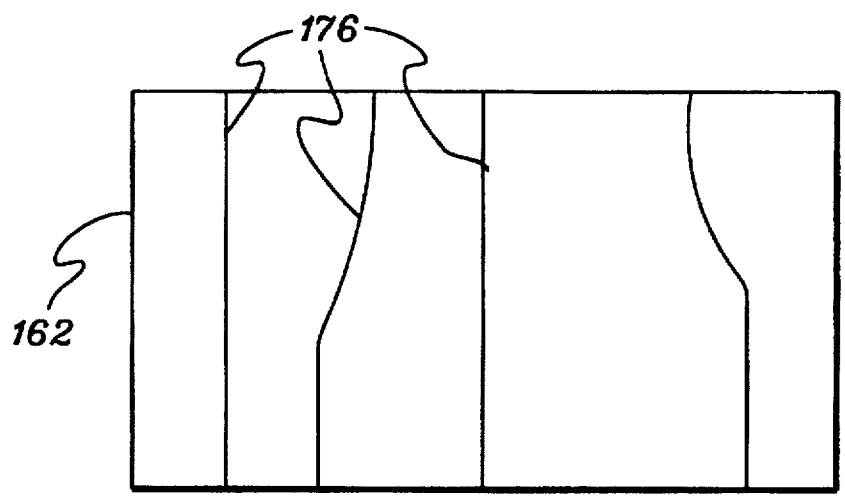
FIGS. 31A–C are schematic views of busing chips in accordance with th present invention.
Figure 31B:
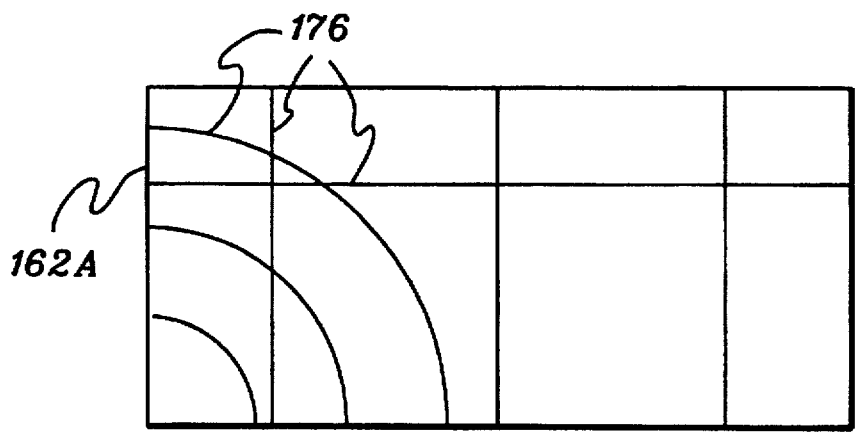
Figure 31C:
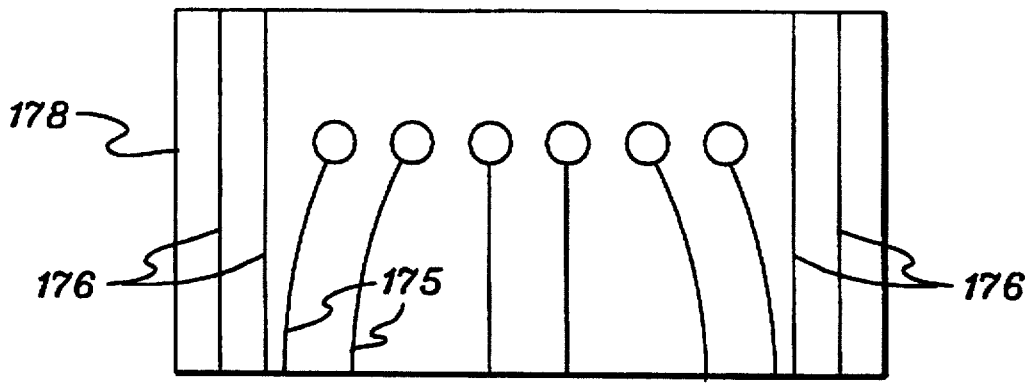

Various types of bussing chips are depicted in FIGS. 31A–C. Regardless of the particular type of bussing chip, the bussing chips are located within electronic modules such that edge surfaces are parallel with side surfaces of the electronic module. Wiring 176 on bussing chip 162 electrically connects points on a first side surface of the electronic module to points on a second side surface of the electronic module.

As a first example, FIG. 31A shows bussing chip 162 containing wiring 176 that connects to two opposite edges of the chip. This type of chip is useful in the embodiments of the present invention depicted up to this point. As shown, wiring 176 need not be straight. Thus, wiring may connect to points not disposed opposite each other.

FIG. 31B depicts a more complicated combination of wiring disposed on bussing chip 162A. Both "horizontal" and "vertical" wiring is shown connecting opposite edges of bussing chip 162. Further, "arc" shaped bussing is shown connecting points on perpendicular edges of the bussing chip. In this particular example, it should be noted that the various wirings are located on different levels so as to be electrically insulated from each other. For example, most simply, all "horizontal" wirings are on one level, all "vertical" wirings are on another level and all "arc" wirings are on a third level. Alternatively, by using vias, all three wirings can be accommodated and kept insulated on two wiring levels.

Bussing chip 178 of FIG. 31C represents an alternate technique for providing bussing from one surface of an electronic module to another surface. A typical IC chip with transfer wiring 175 is shown. However, additional "vertical" transfer wirings 176 are included within the transfer wiring layer to provide bussing connections. Thus, a single chip can provide both active functions and bus interconnects between surfaces of an electronic module containing the chip. Thus, the dedicated bussing chips of previous embodiments can be replaced with active chips having bussing wiring.

Figure 32:
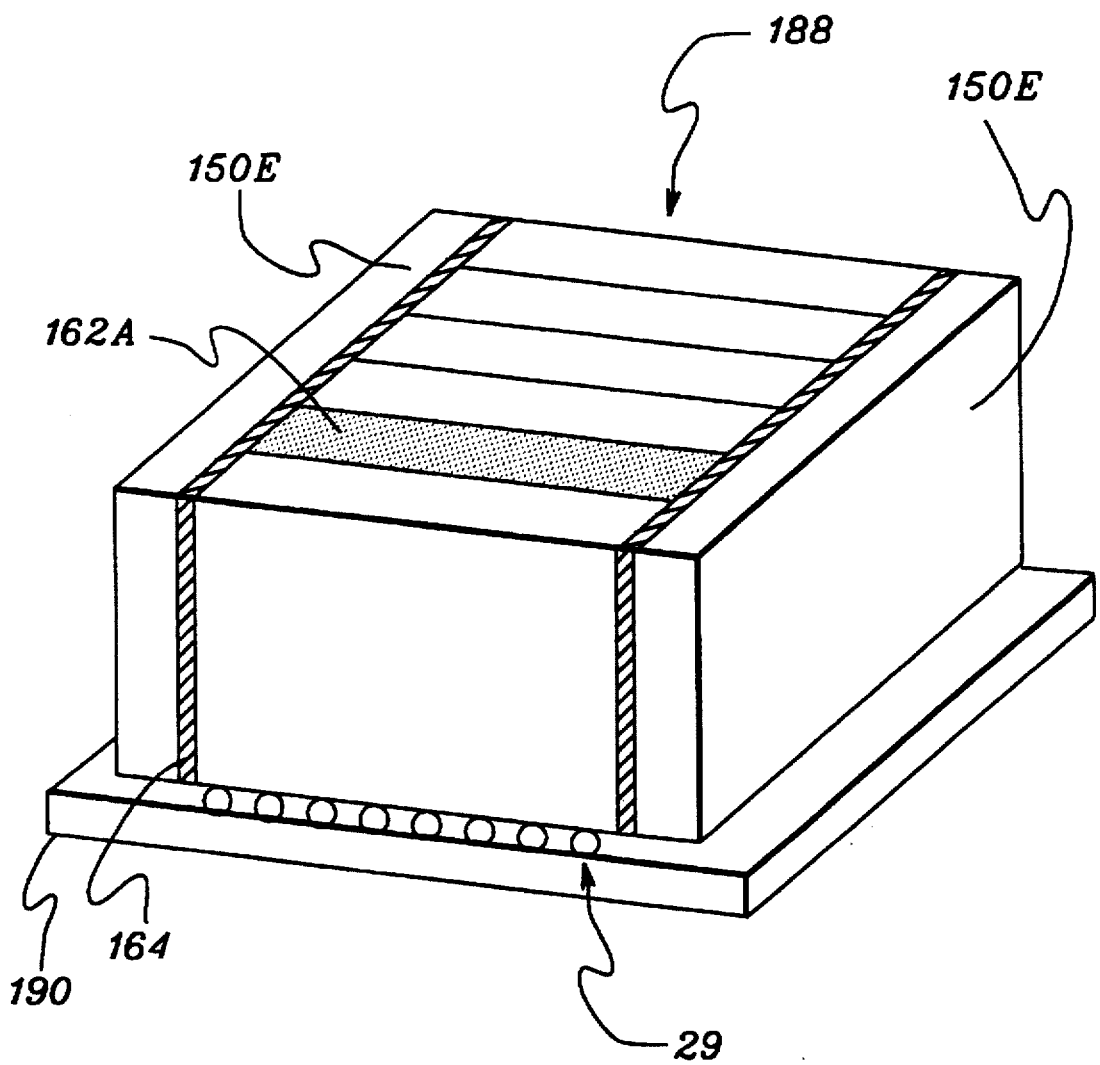
FIG. 32 is a cross-sectional view of a computer unit having multiple processors sharing a common electronic module containing three levels of memory.

The techniques of the present invention may be applied to multiprocessor implementations of computer units. As shown in FIG. 32, an electronic module (188) is bonded to two processors (150E). The electronic module comprises all three levels (L1 /L2 cache and L3 main) of memory. This memory is interconnected to the processors by means of high I/O interconnects (164). The combination of processors and electronic module is solder bump bonded to substrate 190. Wiring within the substrate facilitates interconnection of the various chips within the electronic module as well as external electrical contact through, for example, pins (not shown).

The electrical connections from each processor to the substrate are achieved through bussing chip 162A. Because substrate 190 is perpendicular to each processor chip, "arc" type wiring as shown in FIG. 31B is used. As a general note, each processor may have its own dedicated memory chips within the electronic module, or the processors may share common memory (of all levels). Coordination of activities between processors may be achieved through connections provided on bussing chips or through bussing contained on the individual integrated circuit chips within the stack (for example, as shown in FIG. 31C), or either bussing method used in conjunction with wiring in the substrate.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A temporary workpiece for attaching to a substantially planar surface of a semiconductor structure having a plurality of contacts, said temporary workpiece comprising:

a temporary support;

a temporary adhesive layer disposed on a surface of said temporary support; and a thin-film layer coupled to said temporary support by said temporary adhesive layer, wherein said thin-film layer can be transferred to said substantially planar surface of the semiconductor structure to interconnect at least some of said plurality of contacts by bonding said thin-film layer to said substantially planar surface and decoupling said temporary support from said thin-film layer along said temporary adhesive layer.

2. The temporary workpiece of claim 1, wherein said thin-film layer comprises a metallization layer, and wherein said metallization layer is configured to electrically connect to said semiconductor structure to interconnect said at least some of said plurality of contacts when bonded to said substantially planar surface of said semiconductor structure.

3. The temporary workpiece of claim 1, further comprising a plurality of electrical contacts disposed on said thin-film layer for establishing electrical contact to said semiconductor structure when said thin-film layer is bonded to said semiconductor structure.

4. The temporary workpiece of claim 1, further comprising a substrate disposed between said thin-film layer and said temporary adhesive layer, said substrate providing mechanical support for said thin-film layer when said temporary support is decoupled along said temporary adhesive layer from said thin-film layer.

5. The temporary workpiece of claim 4, further comprising an active circuit layer disposed between said substrate and said temporary adhesive layer, said active circuit layer functioning in association with said semiconductor structure when said temporary workpiece is electrically and mechanically attached thereto.

6. The temporary workpiece of claim 5, wherein said substrate includes a plurality of electrically conductive vias extending between said thin-film layer and said active circuit layer, said plurality of electrically conductive vias providing electrical contact between said thin-film layer and said active circuit layer.

7. The temporary workpiece of claim 5, further comprising a plurality of electrical contacts disposed on said active circuit layer for facilitating electrical coupling thereof to a circuit external from said semiconductor structure.

8. The temporary workpiece of claim 1, further comprising a passive film disposed between said thin-film layer and said temporary adhesive layer, said passive film providing mechanical support for said thin-film layer after said temporary support is decoupled along said temporary adhesive layer from said thin-film layer.

9. The temporary workpiece of claim 8, further comprising a metallization layer disposed between said passive film and said temporary adhesive layer, said metallization layer electrically connecting to said semiconductor structure when said temporary workpiece is electrically and mechanically attached thereto.

10. The temporary workpiece of claim 9, wherein said passive film includes a plurality of electrically conductive vias extending between said thin-film layer and said metallization layer, said plurality of electrically conductive vias providing electrical contact between said thin-film layer and said metallization layer.

11. The temporary workpiece of claim 9, further comprising a plurality of electrical contacts disposed on said metallization layer for facilitating electrical coupling thereof to a circuit external from said semiconductor structure.

* * * * *

UNITED STATES PATENT AND TRADEMARK OFFICE
CERTIFICATE OF CORRECTION

PATENT NO. : 5,786,628
DATED : July 28, 1998
INVENTOR(S) : Beilstein, Jr., et al.

It is certified that error appears in the above-identified patent and that said Letters Patent is hereby corrected as shown below:

Column 5, line 62   -   "ea"   should read   --a--
Column 5, line 66   -   before "subsequent", insert --Fig. 2a--
Column 6, line 14   -   "electric" should read --electrical--
Column 6, line 20   -   after "including" insert --a--
Column 6, line 41   -   "electron" should read --electronic--
Column 6, line 55   -   "city " should read --cavity--
Column 6, line 57   -   before "an", insert --having--
Column 7, line 26   -   "resent" should read --present--
Column 7, line 28   -   "it" should read --unit--
Column 7, line 33   -   "th" should read --the--

Column 17, line 34  -  "15A" should read --115A--
Column 17, line 56  -  "115" should read --115B--

Signed and Sealed this

Sixteenth Day of March, 1999

*Attest:*

Q. TODD DICKINSON

*Attesting Officer*   Acting Commissioner of Patents and Trademarks

UNITED STATES PATENT AND TRADEMARK OFFICE
CERTIFICATE OF CORRECTION

PATENT NO. : 5,786,628
DATED : July 28, 1998
INVENTOR(S) : Beilstein, Jr., et al.

It is certified that error appears in the above-identified patent and that said Letters Patent is hereby corrected as shown below:

Column 16, line 20 - insert after "unsealed" --Optionally, non-mermetic sealing using, for example, a polymeric seal 99 may be used to protect the package from an external environment.--

Column 18, line 41 - insert missing paragraph --The wirebond interconnections between the electronic module, logic/control chip, and/or substrate wiring nets enable a cost effective technique to tailor the function of the electronic package to individual customer specifications. Multiple wirebond pads and wirebond interconnection patterns, i.e., "wirebond programming", between the electronic module, logic/control chip, and substrate can be used to vary the function of the electronic package. This wirebond programming provides substantial flexibility in the assembly of the package in that it can be done either prior to or subsequent to the mechanical coupling of the electronic module, logic/control chip, and substrate.--

Signed and Sealed this

Eighteenth Day of May, 1999

Attest:

Q. TODD DICKINSON

*Attesting Officer*     Acting Commissioner of Patents and Trademarks